United States Patent [19]

Matsuzawa

[11] Patent Number: 6,072,353
[45] Date of Patent: *Jun. 6, 2000

[54] LOGIC CIRCUIT WITH OVERDRIVEN OFF-STATE SWITCHING

[75] Inventor: Akira Matsuzawa, Yawata, Japan

[73] Assignee: Matsushita Electric Industrial Co., Ltd., Kadoma, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/636,559

[22] Filed: Apr. 23, 1996

[30] Foreign Application Priority Data

Apr. 26, 1995 [JP] Japan ................................ 7-102094

[51] Int. Cl.⁷ .................................................. H03K 17/16
[52] U.S. Cl. .............................................................. 327/390
[58] Field of Search ............................. 326/17, 18, 19, 326/20, 88, 92; 327/108, 112, 374, 376, 377, 390, 589, 430, 536, 382

[56] References Cited

U.S. PATENT DOCUMENTS

| | | | |
|---|---|---|---|
| 5,059,816 | 10/1991 | Kobatake | 326/88 |
| 5,065,049 | 11/1991 | Jang | 326/88 |
| 5,268,600 | 12/1993 | Yeu | 326/88 |
| 5,296,765 | 3/1994 | Williams et al. | 307/572 |
| 5,594,380 | 1/1997 | Nam | 327/589 |
| 5,680,071 | 10/1997 | Senoh et al. | 327/390 |
| 5,686,854 | 11/1997 | Smith | 327/374 |
| 5,699,018 | 12/1997 | Yamamoto et al. | 330/297 |
| 5,729,165 | 3/1998 | Lou et al. | 327/589 |
| 5,825,217 | 10/1998 | Lehavot | 327/111 |

FOREIGN PATENT DOCUMENTS

| | | |
|---|---|---|
| 4357710 | 12/1992 | Japan . |
| 5022096 | 1/1993 | Japan . |
| 514166 | 1/1993 | Japan . |
| 5160697 | 6/1993 | Japan . |
| 6037604 | 2/1994 | Japan . |
| 6053792 | 2/1994 | Japan . |
| 6204756 | 7/1994 | Japan . |
| 7249979 | 9/1995 | Japan . |
| 7283716 | 10/1995 | Japan . |

*Primary Examiner*—Jeffrey Zweizig
*Attorney, Agent, or Firm*—Renner, Otto, Boisselle & Sklar

[57] ABSTRACT

A logic circuit includes: a main switching means for changing conduction state between at least two terminals in accordance with a voltage supplied to a control terminal; and a voltage converting means for converting a voltage at an input terminal and outputting the converted voltage to the control terminal.

4 Claims, 27 Drawing Sheets

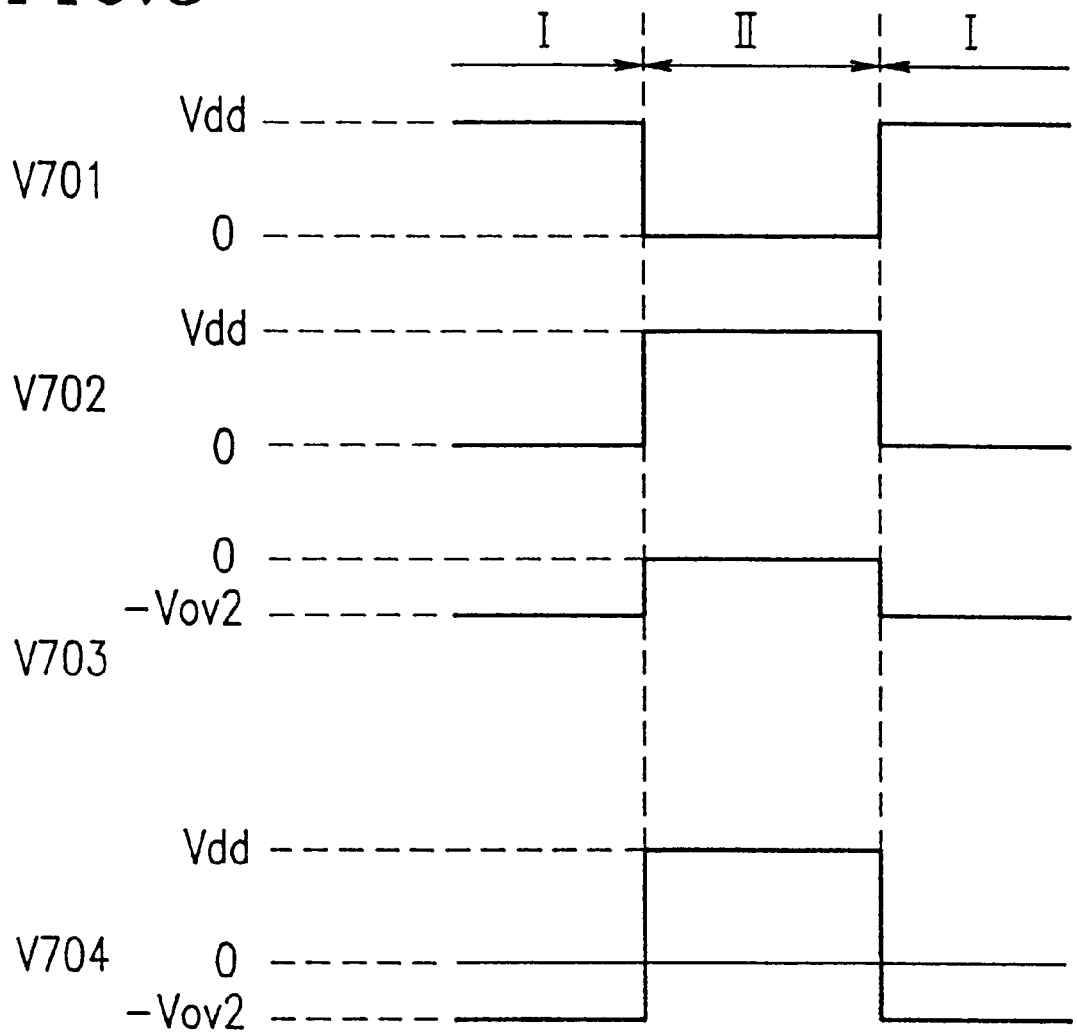

FIG. 9A
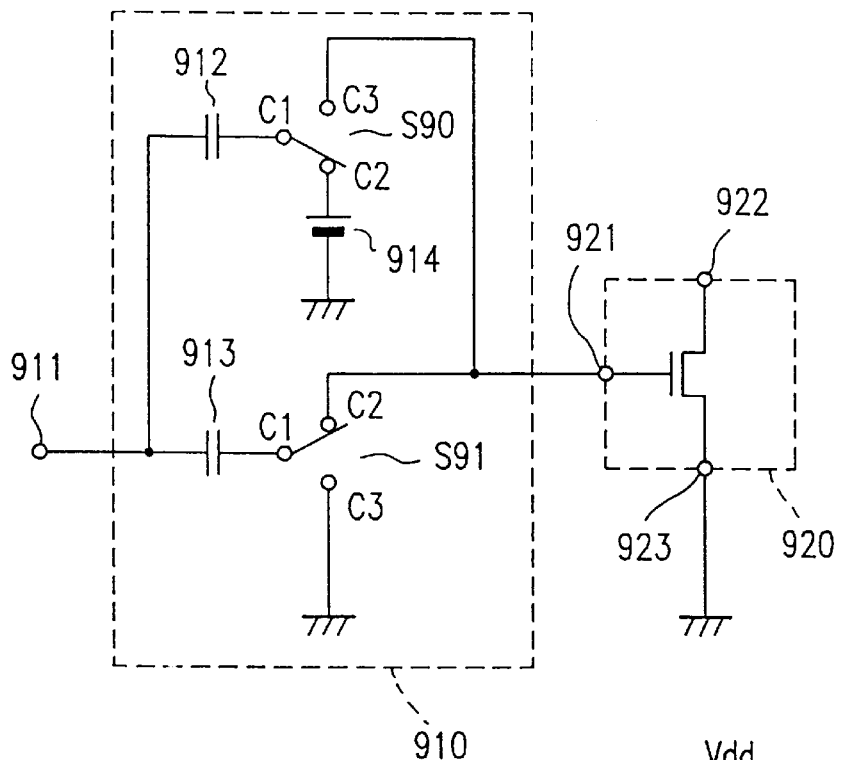
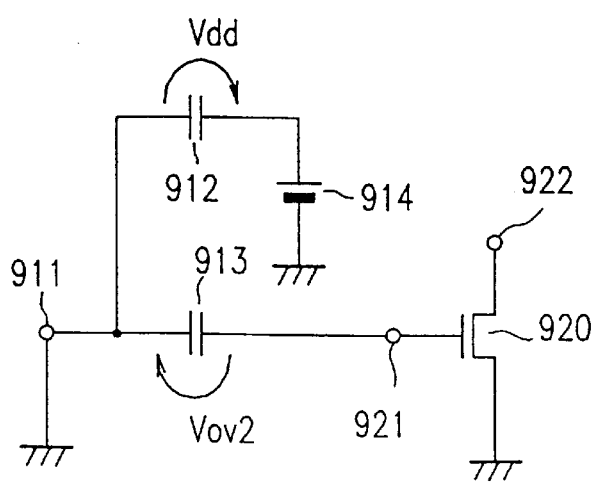
FIG. 9B
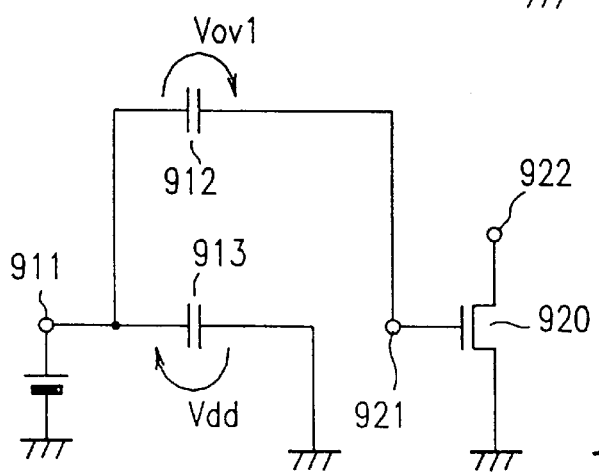
FIG. 9C

FIG.20
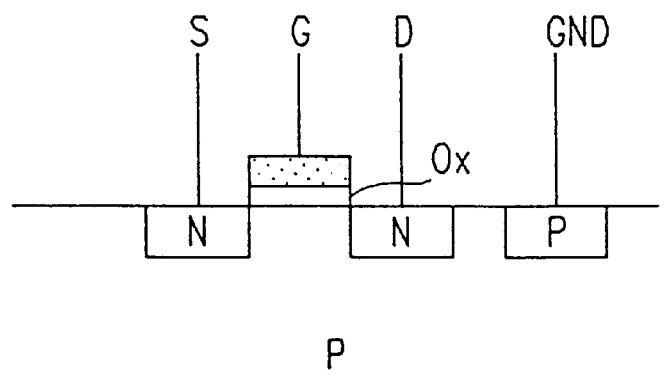
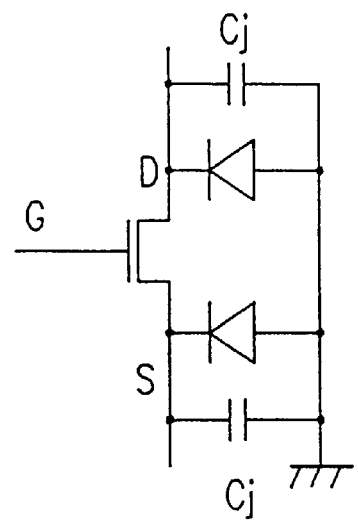
FIG.21
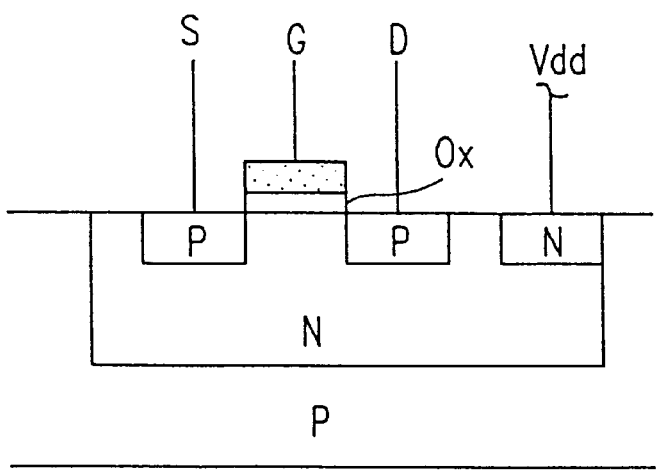
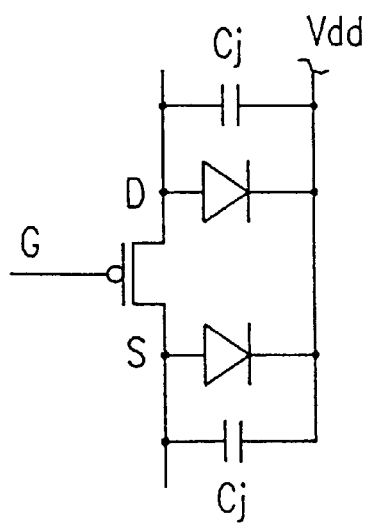

LOGIC CIRCUIT WITH OVERDRIVEN OFF-STATE SWITCHING

BACKGROUND OF THE INVENTION

1. Field of the Invention

The present invention generally relates, as is indicated, to a logic circuit. More particularly, the present invention relates to a logic circuit for high speed operation at low power supply voltage.

2. Description of the Related Art

As described in, for example, Japanese Laid-open Patent Publication No. 5-14166, increasing speed of operation has been tried in recent years by supplying a voltage higher than the power supply voltage between a gate and a source of a transistor using a capacitor. FIG. 31 is a diagram of a logic circuit of the prior art. Reference labels 3101, 3120 and 3110 designate a logic input terminal, an output terminal and a power supply for supplying a voltage of Vdd, respectively. Reference labels 3108 and 3109 designate a P-channel FET (field effect transistor) and an N-channel FET, respectively. Reference labels 3106 and 3107 designate bias power supplies for supplying a voltage of Vs. Reference labels 3102 and 3103 designate capacitors. Reference labels 3104 and 3105 designate an N-channel FET and a P-channel FET, respectively.

However, the logic circuit shown in FIG. 31 suffers from the following inherent limitations. That is to say, a leak current flows when the FETs 3108 and 3109 are in an OFF state. Furthermore, it is not possible in the prior art to sufficiently drive (i.e., overdrive) the FETs 3108 and 3109, or to sufficiently cut off the FETs 3108 and 3109 by biasing its gate with deep backward bias voltage. Therefore, the logic circuit according to the prior art results in a high dissipation power and cannot perform a high-speed operation at a low voltage.

SUMMARY OF THE INVENTION

According to one aspect of the present invention, a logic circuit includes: a main switching means for changing the conduction state between at least two terminals in accordance with a voltage supplied to a control terminal; and a voltage converting means for is converting a voltage at an input terminal and outputting the converted voltage to the control terminal.

In one embodiment of the invention, the voltage converting means includes a voltage generating means and a sub switching means.

In another embodiment of the invention, the sub switching means includes an SOI (semiconductor-on-insulator) structure.

In still another embodiment of the invention, the voltage generating means includes at least one of a capacitor; a battery and a high dielectric material.

In still another embodiment of the invention, the voltage converting means supplies a higher voltage than that of the input terminal to the control terminal in a first state, the first state being a state of the input terminal where the main switching means is conductive.

In still another embodiment of the invention, the voltage converting means supplies a lower voltage than that of the input terminal to the control terminal in a second state, the second state being a state of the input terminal where the main switching means is non-conductive.

In still another embodiment of the invention, the voltage converting means supplies a higher voltage than that of the input terminal to the control terminal in a first state; and the voltage converting means supplies a lower voltage than that of the input terminal to the control terminal in a second state; the first state being a state of the input terminal where the main switching means is conductive; and the second state being a state of the input terminal where the main switching means is non-conductive.

In still another embodiment of the invention, the voltage converting means further includes a capacitor of which a first terminal is connected to the input terminal; and wherein the sub switching means connects a second terminal of the capacitor to the control terminal of the main switching means in the first state; and connects the second terminal of the capacitor to the voltage generating means, and connects the control terminal of the main switching means to the ground in a state other than the first state.

In still another embodiment of the invention, the voltage converting means further includes a capacitor of which a first terminal is connected to the input terminal; and wherein the sub switching means connects a second terminal of the capacitor to the control terminal of the main switching means in the second state; and connects the first terminal of the capacitor to the control terminal of the main switching means, and connects the second terminal of the capacitor to the ground in a state other than the second state.

In still another embodiment of the invention, the voltage converting means further includes a first capacitor of which a first terminal is connected to the input terminal and a second capacitor of which a first terminal is connected to the input terminal; and wherein the sub switching means connects a second terminal of the first capacitor to the ground and connects a second terminal of the second capacitor to the control terminal of the main switching means in the first state; and connects the second terminal of the first capacitor to the control terminal of the main switching means and connects the second terminal of the second capacitor to the voltage generating means in the second state.

In still another embodiment of the invention, the main switching means includes an N-channel MOS FET.

In still another embodiment of the invention, the main switching means includes a P-channel MOS FET.

In still another embodiment of the invention, the main switching means includes a complementary MOS FETs.

According to another aspect of the invention, a logic circuit includes: a first and a second main switching means for changing conduction state between at least two terminals in accordance with a voltage supplied to a control terminal; a first voltage converting means for converting a voltage at an input terminal and outputting the converted voltage to the control terminal of the first main switching means; and a second voltage converting means for converting a voltage at an input terminal and outputting the converted voltage to the control terminal of the second main switching means, wherein the first voltage converting means includes a first capacitor having a first terminal and a second terminal, a second capacitor having a first terminal and a second terminal, a first sub switching means, and a first voltage generating means; the first terminal of the first capacitor and the first terminal of the second capacitor being connected to the input terminal; the second voltage converting means includes a third capacitor having a first terminal and a second terminal, a fourth capacitor having a first terminal and a second terminal, a second sub switching means, and a second voltage generating means; the first terminal of the third capacitor and the first terminal of the fourth capacitor being connected to the input terminal through an inverter;

the first sub switching means connects a second terminal of the first capacitor to the ground and connects a second terminal of the second capacitor to the control terminal of the first main switching means in the first state; and connects the second terminal of the first capacitor to the control terminal of the first main switching means and connects the second terminal of the second capacitor to the first voltage generating means in the second state; and the second sub switching means connects the second terminal of the first capacitor to the ground and connects the second terminal of the second capacitor to the control terminal of the first main switching means in the second state; and connects the second terminal of the first capacitor to the control terminal of the second main switching means and connects the second terminal of the second capacitor to the second voltage generating means in the first state.

Thus, the invention described herein makes possible the advantage of providing a logic circuit which enables a high-speed operation at a low power supply voltage, and in which a leak current (i.e., a dissipation power) is small. For at least these advantages, the logic circuit according to the present invention contributes to increasing operation speed and reducing dissipation power, especially for a battery-powered portable equipment.

These and other advantages of the present invention will become apparent to those skilled in the art upon reading and understanding the following detailed description with reference to the accompanying figures.

BRIEF DESCRIPTION OF THE DRAWINGS

FIG. 8 is a diagram illustrating voltages of nodes 701–704 in FIG. 7 in states I and II.

FIGS. 9A–9C are diagrams of a third example of the logic circuit according to the present invention.

FIG. 20 is a diagram illustrating a structure of an N-channel MOS FET and its equivalent circuit.

FIG. 21 is a diagram illustrating a structure of a P-channel MOS FET and its equivalent circuit.

FIGS. 28A and 2B are graphs showing voltages Va and Vc of the logic circuit of the prior art, and voltages Va and Vc of the logic circuit of the present invention, respectively at the rising edge of the output signal.

DESCRIPTION OF THE PREFERRED EMBODIMENTS

The present invention will now be described in detail with reference to the drawings, wherein like elements are referred to with like reference labels throughout. In this specification, "V" followed by a reference label representing a node designates a voltage potential of the node with respect to the ground. For example, a "voltage V1" represents a voltage potential of the "node 1" from the ground level. For the sake of simplicity, a voltage potential of a node with respect to the ground level is referred to as a "voltage of the node".

In this specification, in an ideal state, a logic low level (hereinafter, referred to as an "L (low) level") is equal to 0 V (i.e., the ground potential), a logic high level (hereinafter, referred to as an "H (high) level") is equal to a voltage potential higher than that of the ground by a power supply voltage Vdd. Ideally, a node of a logic circuit (especially for an output node) should be either of an H level and an L level, should not be at an intermediate potential level between the H level and the L level. In an actual logic circuit, however, a voltage of a node reads an intermediate voltage level in an transient state.

Figure 1:
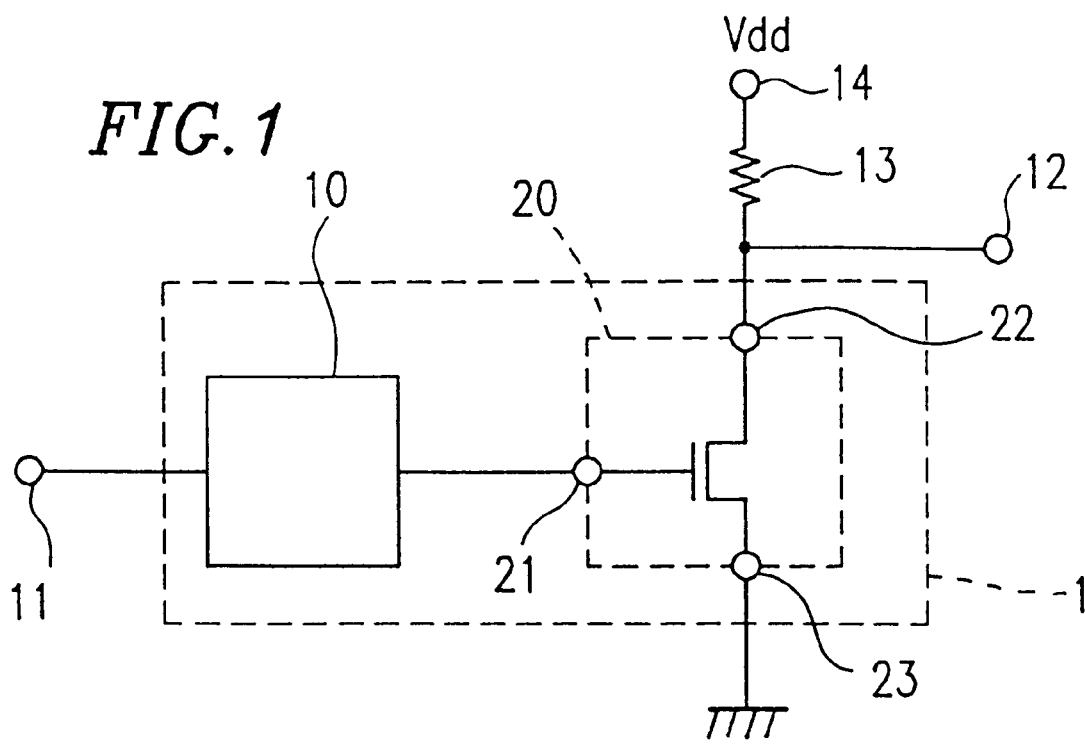
FIG. 1 is a schematic diagram of a logic circuit 1 according to the present invention.

FIG. 1 is a schematic diagram of a logic circuit 1 according to the present invention. The logic circuit 1 includes a voltage converter 10 and a main switching device 20. The voltage converter 10 drives the main switching device 20 in accordance with a voltage of node 11.

The main switching device 20 is an active device having nodes 21–23, and a conduction state between nodes 22 and 23 changes in accordance with a voltage of the nodes 21. In this specification, a state wherein a switching device conducts a current is referred to as an "ON" state, and a state wherein a switching device does not conduct a current is referred to as an "OFF" state. As the main switching device 20, for example, an FET (field effect transistor) can be used. When an FET is used as the main switching device 20, nodes 21, 22 and 23 correspond to a gate, a drain and a source, respectively.

Node 14 is supplied with a power supply voltage Vdd. A resistor 13 pulls up node 12, which functions as an output terminal of the logic circuit 1, to the power supply voltage Vdd. When the main switching device 20 is ON state, node 12 is at the L level. When the main switching device 20 is OFF state, node 12 is at the H level. In FIG. 1, although nods 22 is pulled up, and node 23 is connected to the ground, the configuration is not limited to this. For example, as the main switching device 20, a plurality of switching device which are connected so as to constitute a transfer gate can be utilized.

The voltage converter 10 converts a voltage of node 11 and then outputs the converted voltage to node 21, thereby improving characteristics of the main switching device 20. These improvements include several aspects: increasing a switching speed (i.e., an improvement in transient characteristics), and reducing a ON-state resistance of a switching device (i.e., an improvement in static characteristics). The voltage converter 10 used in the logic circuit 1 according to the present invention has three types: Types 1–3.

In Type 1, when node 11 is at the L level (i.e., the ground level), node 21 is at the ground level, and when node 11 is at the H level (i.e., the Vdd level), node 21 is at a voltage level of (Vdd+Vov1). Here, Vdd and Vov1 designate positive voltage values. Therefore, in the logic circuit 1 of Type 1, when node 21 is at the H level, i.e., the main switching device 20 is ON state, the main switching device 20 is overdriven. In other words, when the main switching device 20 is ON state, node 21 which in a control terminal of the main switching device 20 1s supplied with a higher voltage than Vdd. This enables reduction in a turn-on time of the main switching device 20, and reduction in a turn-on resistance (i.e., a resistance corresponding to a drain-source voltage VDS(sat) in ON state) of the main switching device 20. As the main switching device 20 used in the logic circuit 1 of Type 1, an FET of which threshold voltage Vt is equal to 0.35 V or more is preferably used. The threshold voltage Vt is a gate-source voltage Vgs when a drain current Id is zero, which is also referred to as a pinch-off voltage.

In Type 2, when node 11 is at the L level (i.e., the ground level), node 21 is at a level of −Vov2, and when node 11 is at the H level (i.e., the Vdd level), node 21 is at a voltage level of Vdd. Here, Vov2 designates positive voltage values. Therefore, in the logic circuit 1 of Type 2, when node 21 is at the L level, i.e., the main switching device 20 is OFF state, the main switching device 20 is cut off sufficiently. In other words, when the main switching device 20 is OFF state, node 21 which is a control terminal of the main switching device 20 is supplied with a lower voltage than the ground level. This enables reduction in a turn-off time of the main switching device 20, and increasing a turn-off off resistance of the main switching device 20. As the main switching device 20 used in the logic circuit 1 of Type 2, an FET of which threshold voltage Vt is equal to 0.35 V or less is preferably used.

In Type 3, when node 11 is at the L level (i.e., the ground level), node 21 is at a level of −Vov2, and when node 11 is at the H level (i.e., the Vdd level), node 21 is at a voltage level of (Vdd+Vov1). Therefore, in the logic circuit 1 of Type 3, when node 21 is at the H level, i.e., the main switching device 20 is ON state, the main switching device 20 is overdriven. In other words, when the main switching device 20 is ON state, node 21 which is a control terminal of the main switching device 20 is supplied with a higher voltage than Vdd. This enables reduction in a turn-on time of the main switching device 20, and reduction in a turn-on resistance (i.e., a resistance corresponding to a drain-source voltage VDS(sat) in ON state) of the main switching device 20.

In the logic circuit 1 of Type 3, when node 21 is at the L level, i.e., the main switching device 20 is OFF state, the main switching device 20 is cut off sufficiently. In other words, when the main switching device 20 is OFF state, node 21 which is a control terminal of the main switching device 20 is supplied with a lower voltage than the ground level. This enables reduction in a turn-off time of the main switching device 20, and increasing a turn-off resistance (i.e., a resistance corresponding to a drain-source voltage VDS(sat) In ON state) of the main switching device 20. As the main switching device 20 used in the logic circuit 1 of Type 3, an FET of which threshold voltage Vt is equal to 0.35 V or less is preferably used.

EXAMPLE 1

Figure 2A:
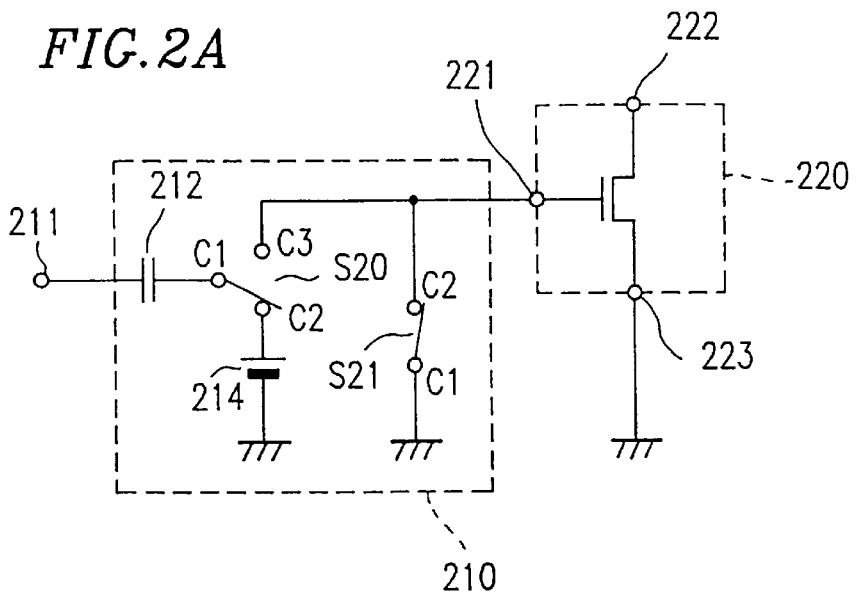
FIGS. 2A–2C are diagrams of a first example of the logic circuit according to the present invention.
Figure 2B:
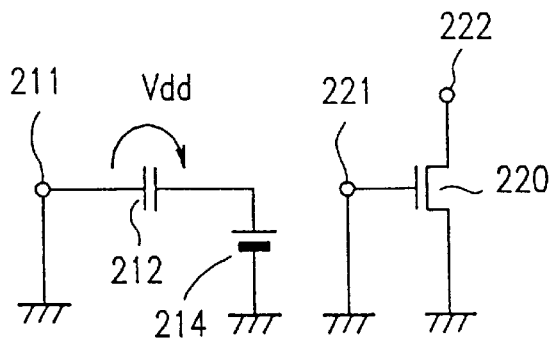
Figure 2C:
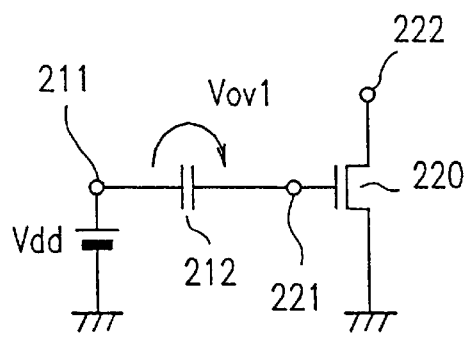

FIGS. 2A–2C are diagrams of a first example of the logic circuit according to the present invention. The logic circuit of the first example is classified into the above Type 1.

The operation of the logic circuit shown in FIG. 2A will be described below. The logic circuit shown In FIG. 2A includes a voltage converter 210 and a main switching device 220. Node 211 receives an input signal from an external device, thereby being set to either of the H level and the L level. In this specification, a state wherein a main switching device (designated by the reference label 220 in the first example) is OFF is referred to as "state I", and a state wherein a main switching device is ON is referred to as "state II". In state II, the voltage converter 210 outputs to node 221 a voltage of (Vdd+Vov1) higher than the voltage Vdd which is supplied to node 211. As a result, characteristics of the main switching device 220 is improved. As the main switching device 220, a MOS (metal-oxide-semiconductor) FET is used, and node 221, 222 and 223 are a gate, a drain and a source, respectively. In all the examples including the first example, as the main switching device, an SOI (semiconductor-on-insulator) transistor, an MES (metal-semiconductor) FET, a bipolar transistor, a TFT (thin film transistor) and the like can be used.

The voltage converter 210 includes switches S20 and S21, a voltage generator 214, and a capacitor 212. Switches S20 and S21 can be constituted using a plurality of FETs. Although a power supply voltage Vdd is used as the voltage generator 214 in the first example, a voltage value supplied by the voltage generator 214 is not limited to Vdd. Although an external power supply is used of the voltage generator 214 in the first example, the type of the voltage generator 214 is not limited to this. As the voltage generator in all examples in the specification, a capacitor, a battery and the like can be used. As a capacitor, such as the capacitor 212 and a capacitor as the voltage generator 214, a capacitor using material of a high dielectric constant is preferably used for the reason described in detail later.

Figure 23:
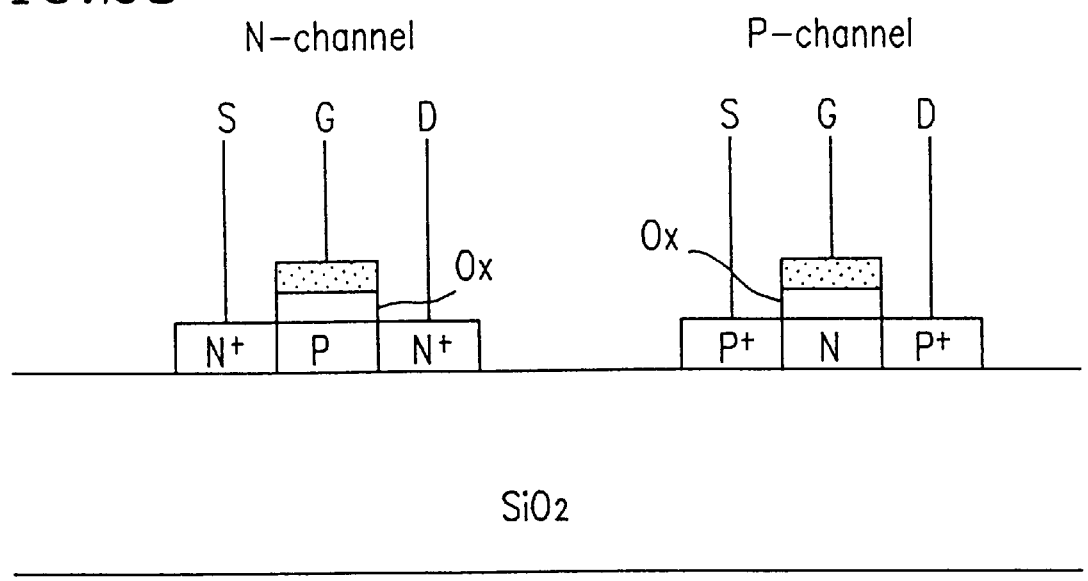
FIG. 23 is a diagram illustrating a structure of an N-channel transistor and a P-channel transistor both having an SOI structure.

In state I, the switch S20 is placed in a position such that contact C1 is connected to contact C2, while in state II, the switch S20 is placed in a position such that contact C1 is connected to contact C3. In state I, the switch S21 is placed in a position such that contact C1 is connected to contact C2, while in state II, the switch S21 is placed in a position such that contact C1 is not connected to contact C2. FIG. 2A corresponds to state I. FIG. 23 is a diagram representing an equivalent circuit of the logic circuit shown in FIG. 2A in state I. FIG. 2C is a diagram representing an equivalent circuit of the logic circuit shown in FIG. 2A in state II.

As shown in FIG. 2B, in state I, node 211 is at the L level. In state I, node 211, to which one terminal of the capacitor 212 is connected, is connected to the ground, while the other terminal of the capacitor 212 is connected to the voltage generator 214. As a result, the capacitor 212 is charged by the voltage Vdd supplied by the voltage generator 214. In state I, node 221 which is a gate of the main switching device 220 is connected to the ground, whereby electric charge in the gate of the main switching device 220 in discharged. An a result, the turn-off time of the main switching device 220 is shortened.

As shown in FIG. 2C, In state II, node 211 is at the H level. In state II, node 211, to which one terminal of the capacitor 212 is connected, is pulled up to the power supply voltage Vdd, while the other terminal of the capacitor 212 is connected to node 221. As a result, node 221 which is a gate of the main switching device 220 is supplied with a voltage of (Vdd+Vov1). Here, Vov1 is a positive voltage and is governed by the voltage supplied by the voltage generator 214 and a gate-source capacitance of the main switching device 220. A relationship C212>>Cgs is preferably satisfied, where C212 and Cs are a capacitance of the capacitor 212 and a capacitance of the gate-source capacitance of the main switching device 220, respectively.

Figure 3:
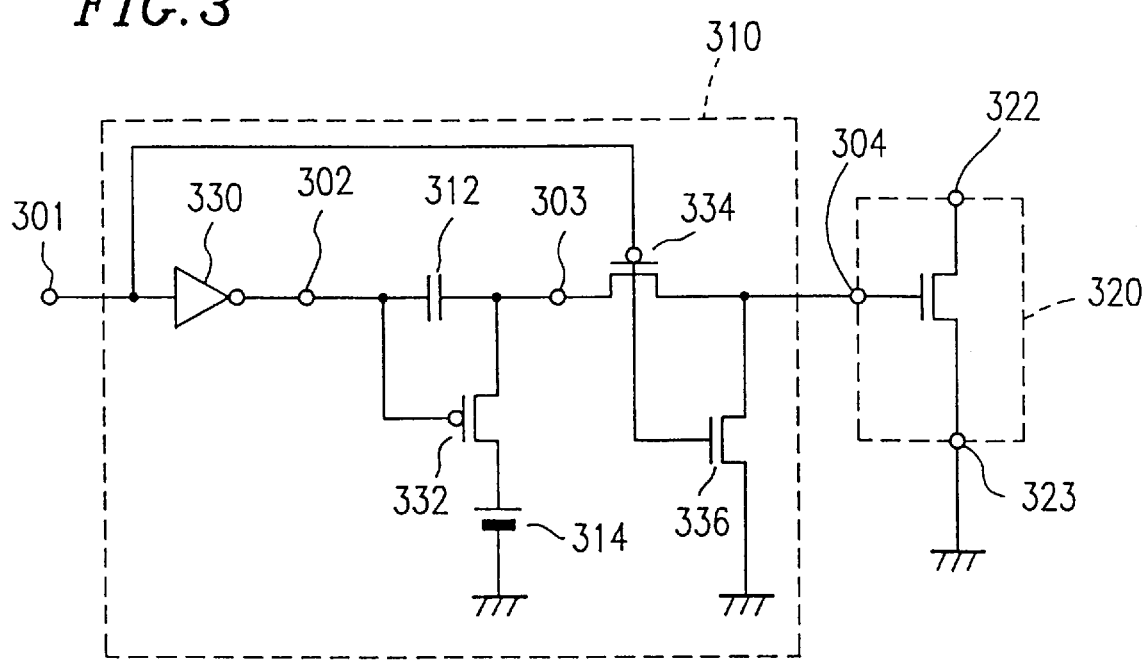
FIG. 3 is a diagram of the first example of the logic circuit according to the present invention using an N-channel FET and P-channel FETs.

FIG. 3 is a diagram of the first example of the logic circuit according to the present invention using an N-channel FET and P-channel FETs. A voltage converter 310 and a main switching device 320 correspond to the voltage converter 210 and the main switching device 220, respectively. An inverter 330 inverts a voltage supplied to node 301 and then outputs to node 302. In other words, node 302 is at the L level when node 301 is at the H level, while nods 302 is at the H level when node 301 is at the L level. A capacitor 312 and a voltage generator 314 correspond to the capacitor 212 and the voltage generator 214, respectively. FETs 332 and 334 function as the switch S20, and an FET 336 functions as the switch S21. The main switching device 320 corresponds to the main switching device 220, and nodes 304, 322 and 323 correspond to nodes 221, 222 and 223, respectively. The logic circuit shown in FIG. 3 operates in the same manner as discussed above with respect to FIGS. 2A–2C with the exception that the main switching device 320 is OFF state when node 301 is at the H level, while the main switching device 320 is ON state when nods 301 is at the L level (i.e., a logic of node 301 is inverted). Thus node 302 corresponds to node 211. The same is also true with respect to other examples in this specification. Therefore, using of an iverter per se is not an essential part of the present invention, rather the inverter is necessary to switch switching devices in the voltage converter at the predetermined phase. Therefore, further details are omitted.

Figure 4:
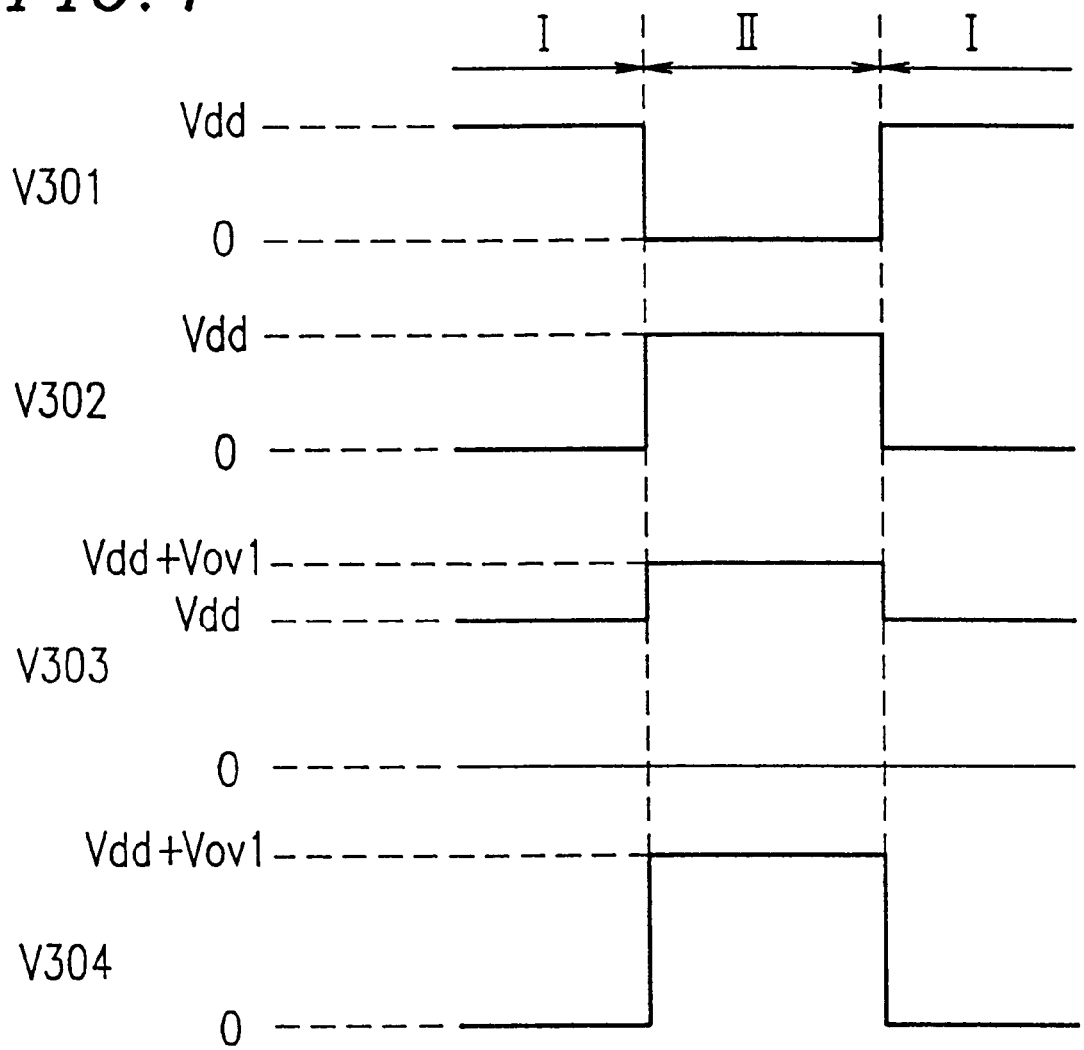
FIG. 4 is a diagram illustrating voltages of nodes 301–304 in FIG. 3 in states I and II.

FIG. 4 is a diagram illustrating voltages of nodes 301–304 in FIG. 3 in states I and II. A voltage V304 of node 304, which is a gate of the main switching device 320, is (Vdd+Vov1) in state II. Due to the voltage V304, the main switching device 320 is sufficiently driven. As a result, this circuit topology enables reduction in the turn-on time and the turn-on resistance.

Here, a drain current Id is given by the following equation as a function of a gate-source voltage Vgs of an N-channel MOS translator used as the main switching device 320:

$$Id = K(Vgs - Vt)^2,$$

where K is a positive constant, Vt is a threshold voltage of the N-channel FET. In the near future, an operation voltage of an LSI (large scale integrated circuit) will become lower and lower for high reliability and low power dissipation. It is assumed that a power supply voltage Vdd is 1.0 V, the threshold voltage Vt is 0.35 V, and the voltage generator 314 supplies the power supply voltage Vdd. A ratio of the drain current of the main switching device 320 in the logic circuit according to the present invention to a drain current in a logic circuit according to the prior art is as follows:

$$(1.0+1.0-0.35)^2/(1.0-0.35)^2 = 6.44.$$

As will be appreciated from the above expression, the present invention allows the drain current of the main switching device 320 to increase, thereby enabling a higher operation.

Figure 5A:
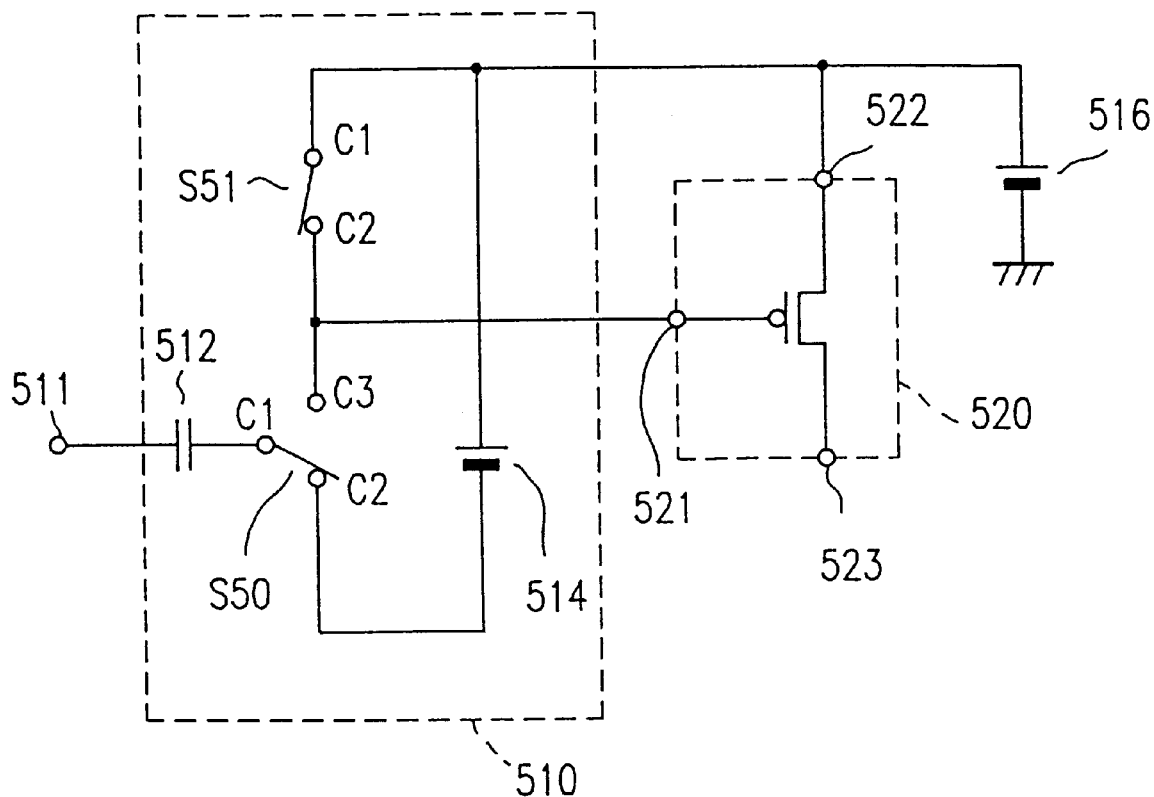
FIG. 5A is a diagram of a logic circuit for substituting a P-channel FET in place of the N-channel FET used as the main switching device 220 in FIG. 2A.
Figure 5B:
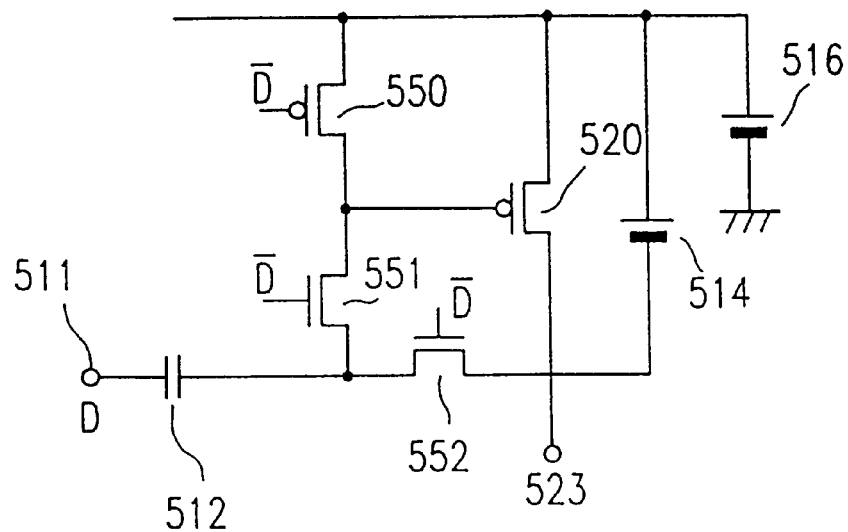
FIG. 5B is a diagram of a logic circuit according to the present invention using N-channel FETs and a P-channel FET as the two switches.

FIG. 5A is a diagram of a logic circuit for substituting a P-channel FET in place of the N-channel FET used as the main switching device 220 in FIG. 2A. FIG. 5B is a diagram of a logic circuit according to the present invention using N-channel FETs and a P-channel FET as the two switches. A voltage converter 510 and a main switching device 520 correspond to the voltage converter 210 and the main switching device 220, respectively. Node 511, 521–523 correspond to node 211, 221–223, respectively. Switches S50 and S51, a capacitor 512, and a voltage generator 514 correspond to the switches S20 and S21, the capacitor 212, and the voltage generator 214, respectively. A power supply 516 supplies an output voltage to node 523 through the main switching device 520. Although the voltage generator 514 supplies the same voltage value as a voltage of Vdd supplied by the power supply 516, however, the voltage level is not limited to Vdd.

The logic circuit shown in FIG. 5A is described below. In state I, the switch S50 is placed in a position such that contact C1 is connected to contact C2, while in state II, the switch S50 is placed in a position such that contact C1 is connected to contact C3. In state I, the switch S51 is placed in a position such that contact C1 is connected to contact C2, while in state II, the switch S51 is placed in a position such that contact C1 is not connected to contact C2. In state I, one terminal of the capacitor 512, which is connected to node 511, is at the H level, while the other terminal of the capacitor 512, which is connected to contact C1 of the switch S50, is at the ground level. Therefore, in state I, the capacitor 512 is charged. On the other hand, the gate of the main switching device 520 (i.e., node 521) is set to be at the H level.

In state II, node 511 will go down to the L level, and the other terminal of the capacitor 512 will be connected to node 521. As a result, node 521 is supplied with a voltage of −Vov1 (Vov1: a positive voltage).

In FIG. 5B, FET 550 corresponds to the switch S51, and FETs 551 and 552 correspond to the switch S50. A signal "D bar" supplied to the gate of the FET 550 is a signal obtained by inverting the signal D. The logic circuit shown in FIG. 5B is a complementary circuit to the logic circuit shown in FIG. 3, and its operation in similar to that of the logic circuit of FIG. 3.

EXAMPLE 2

Figure 6A:
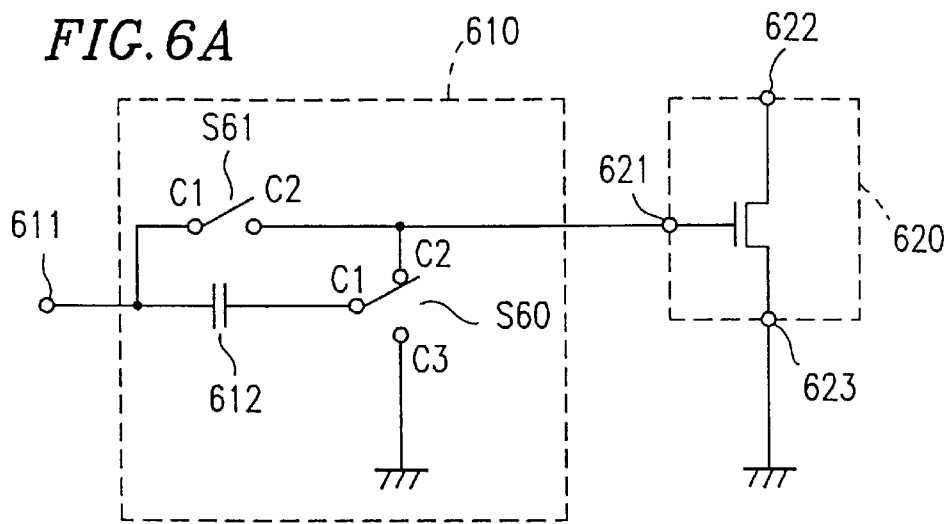
FIGS. 6A–6C are diagrams of a second example of the logic circuit according to the present invention.
Figure 6B:
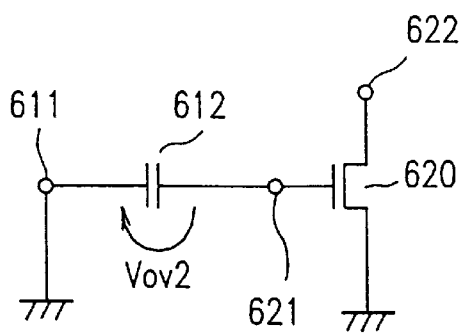
Figure 6C:
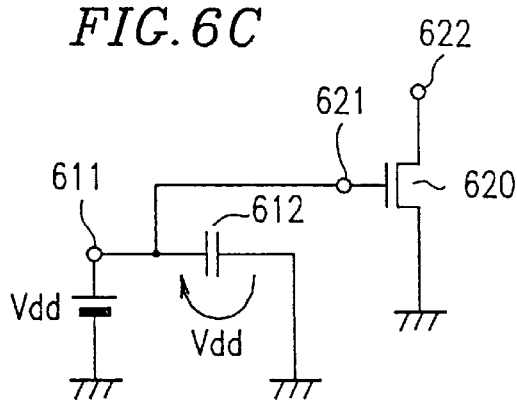

FIGS. 6A–6C are diagrams of a second example of the logic circuit according to the present invention. The logic circuit of the second example is classified into the above Type 2.

The operation of the logic circuit shown in FIG. 6A will be described below. The logic circuit shown In FIG. 6A includes a voltage converter 610 and a main switching device 620. Node 611 receives an input signal from an external device, thereby being set to either of the H level and the L level. In state I, the voltage converter 610 outputs to node 621 a voltage of −Vov2 lower than the ground level (i.e., 0 V) which is supplied to node 611. As a result, characteristics of the main switching device 620 is improved. As the main switching device 620, a MOS (metal-oxide-semiconductor) FET is used, and node 621, 622 and 623 are a gate, a drain and a source, respectively.

The voltage converter 610 includes switches S60 and S61, and a capacitor 612. Switches S60 and S61 can be constituted using a plurality of FETs. Although contact C3 of the switch S60 is connected to the ground in the second example, a voltage value supplied to contact C3 of the switch S60 is not limited to this ground potential. As will be appreciated from the operation described below, however, contact C3 of the switch S60 is preferably connected to the ground.

In state I, the switch S60 is placed in a position such that contact C1 is connected to contact C2, while in state II, the switch S60 is placed in a position such that contact C1 is connected to contact C3. In state I, the switch S61 is placed in a position such that contact C1 is not connected to contact C2, while in state II, the switch S61 is placed in a position such that contact C1 is connected to contact C2. FIG. 6A corresponds to state I. FIG. 6B is a diagram representing an equivalent circuit of the logic circuit shown in FIG. 6A in state I. FIG. 6C is a diagram representing an equivalent circuit of the logic circuit shown in FIG. 6A in state II.

As shown in FIG. 6B, in state I, node 611 is at the L level. In state I, node 611, to which one terminal of the capacitor 612 is connected, is connected to the ground, while the other terminal of the capacitor 612 is connected to node 621. As a result, node 621 which is the gate of the main switching device 620 is supplied with a voltage −Vov2. Here, Vov2 is a positive voltage and is governed by the voltage supplied to node 611 and a gate-source capacitance of the main switching device 620. A relationship C612>>Cgs is preferably satisfied, where C612 and Cgs are a capacitance of the capacitor 612 and a capacitance of the gate-source capacitance of the main switching device 620, respectively.

As shown in FIG. 6C, in state II, node 611, to which one terminal of the capacitor 612 is connected, is at the H level, while the other terminal of the capacitor 612 is connected to the ground. As a result, the capacitor 612 is charged by the voltage Vdd supplied by an external device connected to node 611.

Figure 7:
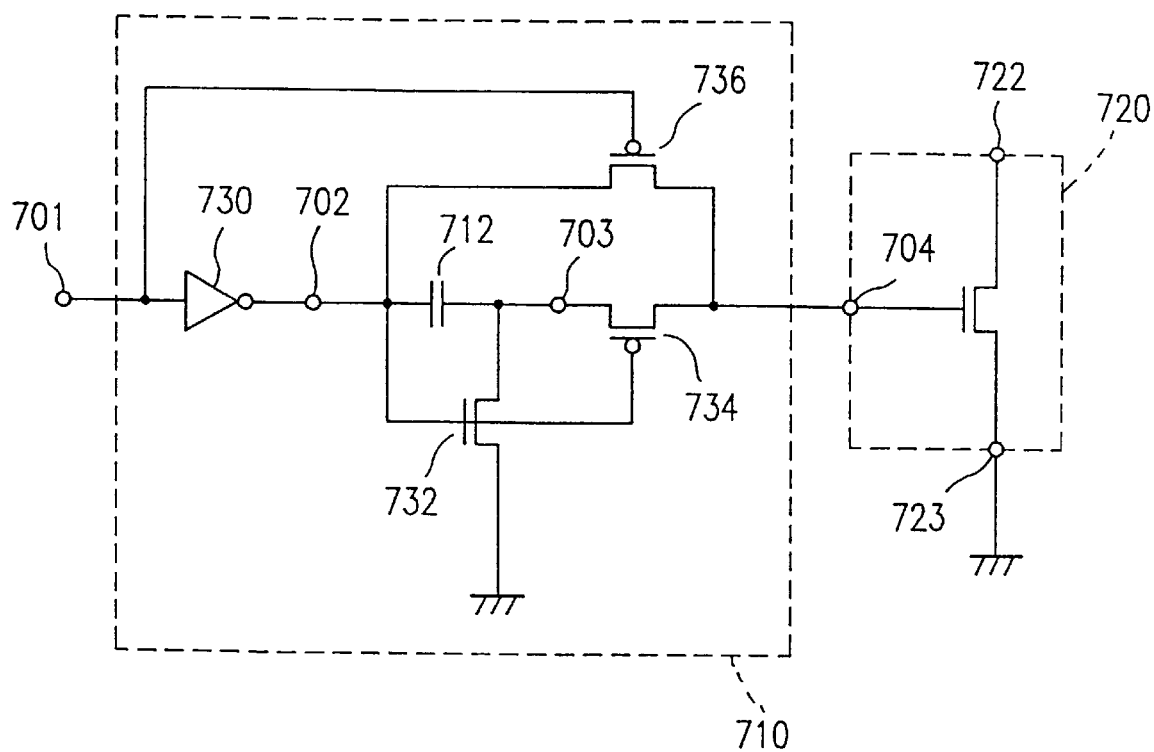
FIG. 7 is a diagram of the second example of the logic circuit according to the present invention using an N-channel FET and P-channel FETs.

FIG. 7 is a diagram of the second example of the logic circuit according to the present invention using an N-cannel FET and P-channel FETs. A voltage converter 710 and a main switching device 720 correspond to the voltage converter 610 and the main switching device 620, respectively. An inverter 730 inverts a voltage supplied to node 701 and then outputs to node 702. In other words, node 702 is at the L level when node 701 is at the H level, while node 702 is at the H level when node 701 ia at the L level. A capacitor 712 corresponds to the capacitor 612. FETs 732 and 734 function as the switch S60, and an FET 736 functions as the switch S61. The main switching device 720 corresponds to the main switching device 620, and nodes 704, 722 and 723 correspond to nodes 621, 622 and 623, respectively. The logic circuit shown in FIG. 7 operates in the same manner as discussed above with respect to FIGS. 6A–6C. Therefore, further details are omitted.

FIG. 8 is a diagram illustrating voltages of nodes 701–704 in FIG. 7 in states I and II. A voltage V704 of node 704, which is a gate of the main switching device 720, is −Vov2 in state I. Due to the voltage V704, the main switching device 720 is sufficiently cut off. As a result, this circuit topology enables reduction in the turn-off time and increase in turn-off resistance.

EXAMPLE 3

FIGS. 9A–9C are diagrams of a third example of the logic circuit according to the present invention. The logic circuit of the third example is classified into the above Type 3.

The operation of the logic circuit shown in FIG. 9A will be described below. The logic circuit shown in FIG. 9A includes a voltage converter 910 and a main switching device 920. Node 911 receives an input signal from an external device, thereby being set to either of the H level and the L level. In state I, the voltage converter 910 outputs to node 921 a voltage of −Vov2 lower than the ground level (i.e., 0 V) which is supplied to node 911. In state II, the voltage converter 910 outputs to node 921 a voltage of (Vdd+Vov1) higher then a voltage of Vdd which is supplied to node 911. As a result, characteristics of the main switching device 920 is improved. As the main switching device 920, a MOS (metal-oxide-semiconductor) FET is used, nd nods 921, 922 and 923 are a gate, a drain and a source, respectively.

The voltage converter 910 includes switches S90 and S91, a voltage generator 914, and capacitors 912 and 913. Switches S90 and S91 can be constituted using a plurality of FETs. Although a power supply voltage Vdd is used as the voltage generator 914 in the third example, a voltage value supplied by the voltage generator 914 is not limited to Vdd. Although an external power supply is used as th voltage generator 914 in the third example, the type of the voltage generator 914 is not limited to this. As the voltage generator 914, for example, a capacitor using material of a high dielectric constant can be used.

In state I, the switch S90 is placed in a position such that contact C1 is connected to contact C2, while in state II, the switch S90 is placed in a position such that contact C1 is connected to contact C3. In state I, the switch S91 is placed in a position such that contact C1 is connected to contact C2, while in state II, the switch S91 is placed in a position such that contact C1 is connected to contact C3. FIG. 9A corresponds to state I. FIG. 9B is a diagram representing an equivalent circuit of the logic circuit shown in FIG. 9A in state I. FIG. 9C is a diagram representing an equivalent circuit of the logic circuit shown in FIG. 9A in state II.

As shown in FIG. 9B, in state I, node 911 is at the L level. In state I, node 911, to which one terminal of the capacitor 912 is connected, is connected to the ground, while the other terminal of the capacitor 912 is connected to the voltage generator 914. As a result, the capacitor 912 is charged by the voltage Vdd supplied by the voltage generator 914. In state I, node 921 which is a gate of the main switching device 920 is connected to the ground through the capacitor 913. The capacitor 913, as will be described later, is charged in state II, thereby supplying a voltage of Vov2 between nodes 911 and 921. Therefore, a voltage of node 921 will be Vov2. Here, Vov2 is a positive voltage and is governed by the voltage supplied to node 911 (i.e., Vdd) and a gate-source capacitance of the main switching device 920. A relationship C913>>Cgs is preferably satisfied, where C913 and Cgs are a capacitance of the capacitor 913 and a capacitance of the gate-source capacitance of the main switching device 920, respectively.

As shown in FIG. 9C, in state XI, node 911 is at the H level. In state II, node 911, to which one terminal of the capacitor 913 is connected, is pulled up to the power supply voltage Vdd, while the other terminal of the capacitor 913 is connected to the ground. As a result, the capacitor 913 is charged by the power supply voltage Vdd. In state II, node 921 which is the gate of the main switching device 920 is connected to node 911 through the capacitor 912. The capacitor 912, as discussed above, is charged in state I, thereby supplying a voltage of Vov1 between node 911 and 921. Therefore, a voltage of node 921 is (Vdd+Vov1). Here, Vov1 is a positive voltage and is governed by the voltage supplied by the voltage generator 914 (i.e., Vdd) and a gate-source capacitance of the main switching device 920. A relationship C912>>Cgs is preferably satisfied, where C912 and Cgs are a capacitance of the capacitor 912 and a capacitance of the gate-source capacitance of the main switching device 920, respectively.

Figure 10:
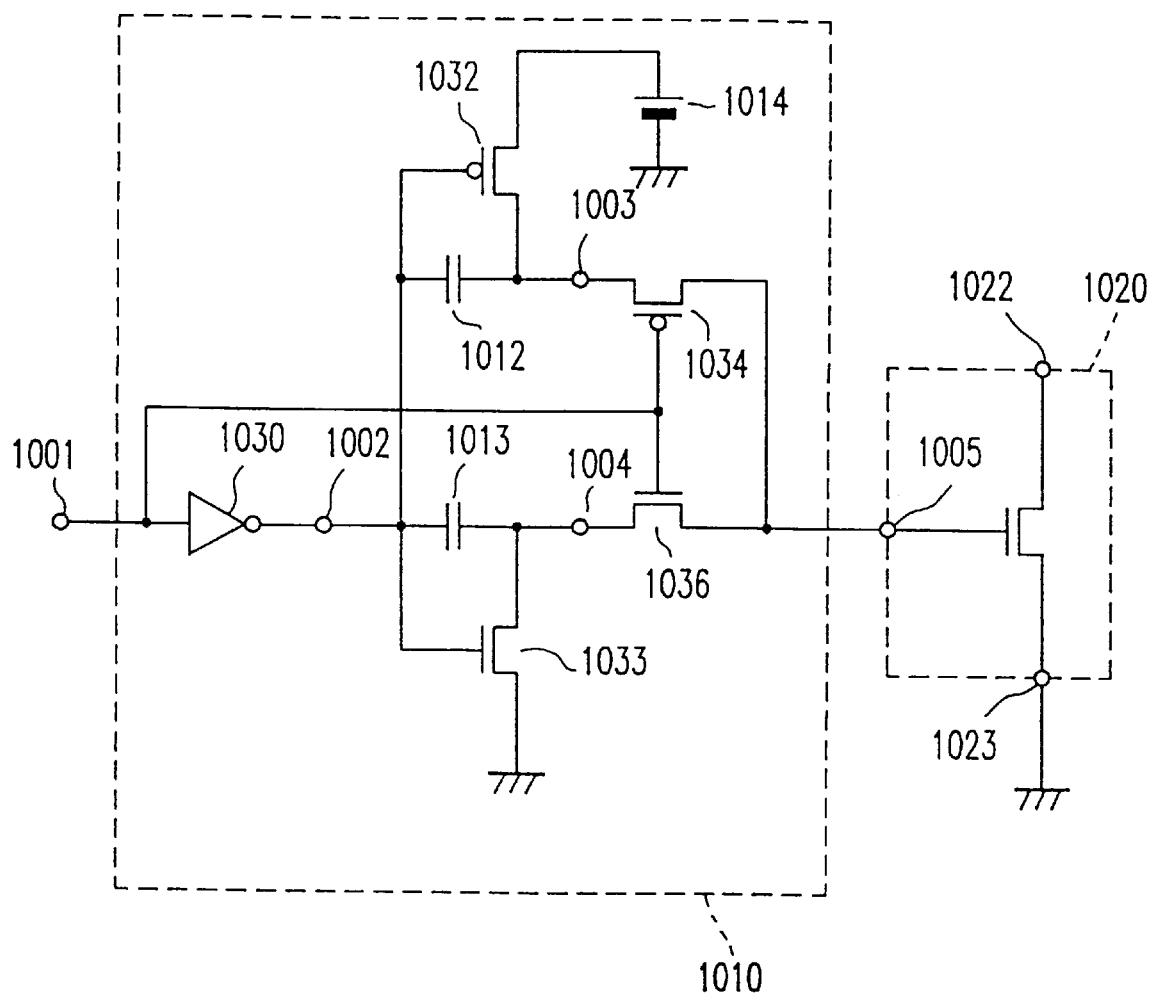
FIG. 10 is a diagram of the third example of the logic circuit according to the present invention using an N-channel FET and P-channel FETs.

FIG. 10 is a diagram of the third example of the logic circuit according to the present invention using an N-channel FET and P-channel FETs. A voltage converter 1010 and a main switching device 1020 correspond to the voltage converter 910 and the main switching device 920, resistively. An inverter 1030 inverts a voltage supplied to node 1001 and then outputs to node 1002. In other words, node 1002 is at the L level when node 1001 is at the H level, while node 1002 is at the H level when node 1001 is at the L level. Capacitors 1012 and 1013, and a voltage generator 1014 correspond to the capacitors 912 and 913, and the voltage generator 914, respectively. FETs 1032 and 1034 function as the switch S90, and an FET 1036 functions as the switch S91. The main switching device 1020 corresponds to the main switching device 920, and nodes 1005, 1022 and 1023 correspond to nodes 921, 922 and 923, respectively. The logic circuit shown in FIG. 10 operates in the same manner as discussed above with respect to FIGS. 9A–9C. Therefore, further details are omitted.

Figure 11:
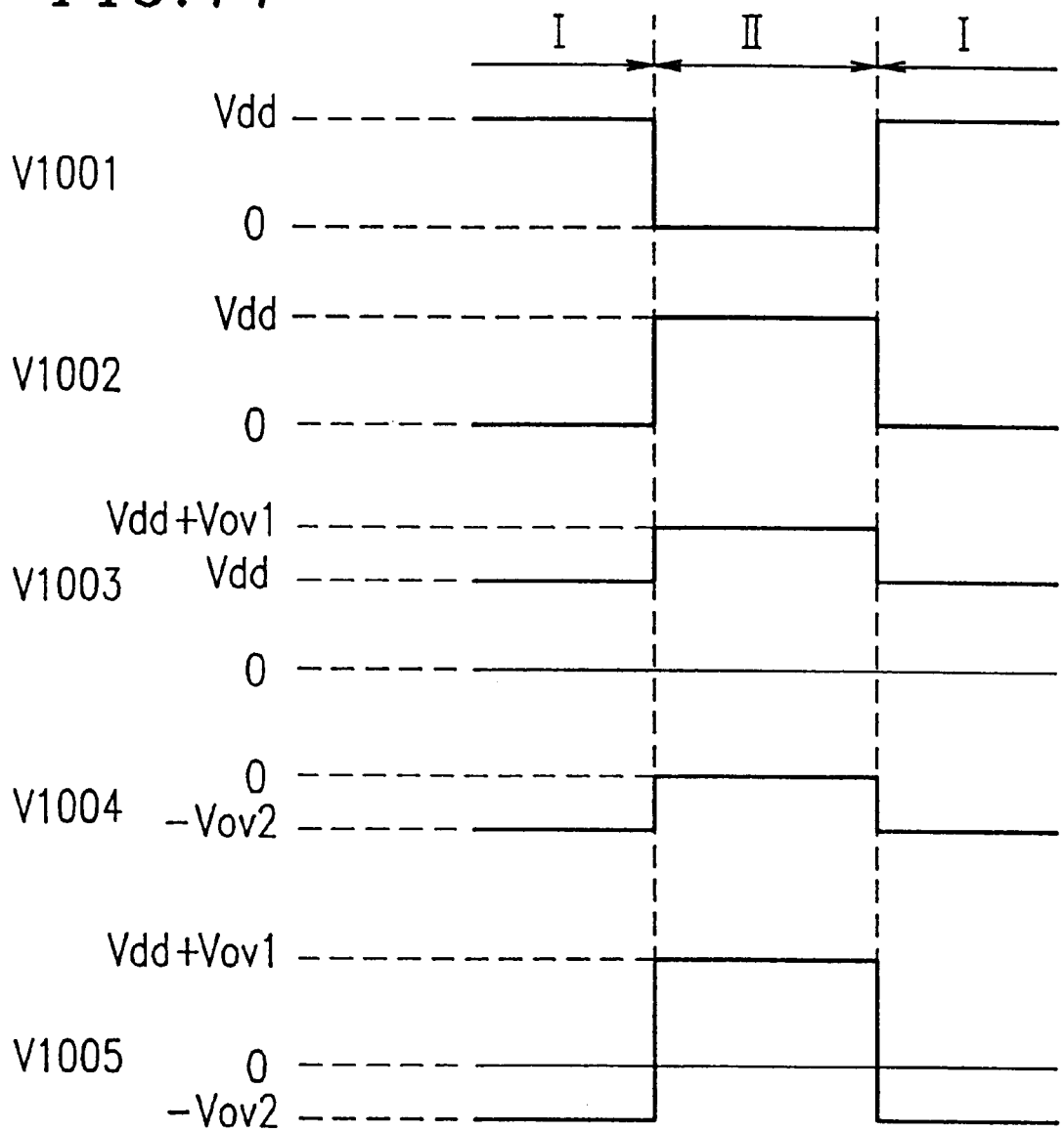
FIG. 11 is a diagram illustrating voltages of nodes 1001–1005 in FIG. 10 in states I and II.

FIG. 11 is a diagram illustrating voltages of nodes 1001–1005 in FIG. 10 in states I and II. A voltage V1005 of node 1005, which is a gate of the main switching device 1020, is −Vov2 in state I and (Vdd+Vov1) in state II. Due to the voltage V1005, the main switching device 1020 is sufficiently driven and sufficiently cut off. As a result, this circuit topology enables reduction in the turn-on time, the turn-off time and the turn-on resistance, and increase in the turn-off resistance.

Figure 12:
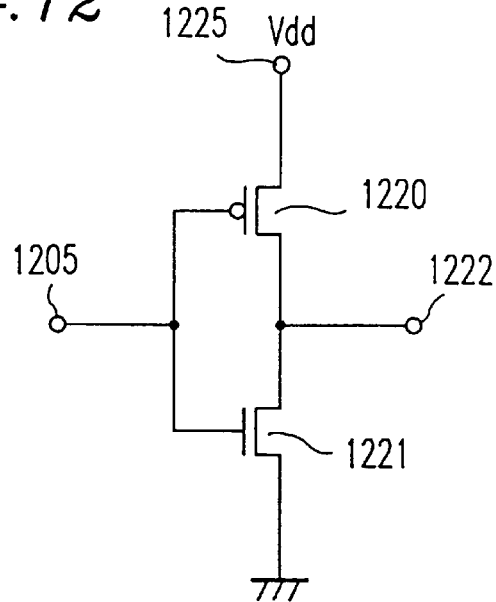
FIG. 12 is a diagram of a circuit configuration for substituting in place of the main switching device 1020 shown in FIG. 10.

FIG. 12 is a diagram of a circuit configuration for substituting in place of the main switching device 1020 shown in FIG. 10. Node 1205 corresponds to node 1005 and receives the output from the voltage converter 1010. Node 1225 is pulled up to the power supply voltage Vdd. FETs 1220 and 1221 turn on alternately, thereby changing the voltage of node 1222. In other words, the FET 1220 is OFF and the FET 1221 is ON when node 1205 is at the H level, whereby node 1222 will become the L level. The FET 1220 is ON and the FET 1221 is OFF when node 1205 is at the L level, whereby node 1222 will become the H level. The voltage converter in the logic circuit of the third example outputs the voltage of −Vov2 (<0) in state I, and outputs the voltage of (Vdd+Vov1) (>Vdd), thereby efficiently driving the main switching devices having the configuration of the series connection of the complementary FETs shown in FIG. 12.

Referring again to FIG. 9A, it is assumed that the voltage generator 914 generates the power supply voltage Vdd, and that node 911 at the H level is equal to the power supply voltage Vdd. Accordingly, the capacitors 912 and 913 are charged by the voltage Vdd. However, the charging voltage is not limited to Vdd. In order to supply a higher voltage to the control terminal (i.e., the gate terminal), thereby overdriving the main switching device, a voltage which the voltage generator 914 generates is preferably high. Although contact C3 of the switch S91 is connected to the ground, contact C3 can be set to a different voltage level. In order to deeply cut off the main switching device, contact C3 is preferably supplied with a lower voltage potential than the ground level.

EXAMPLE 4

Figure 13:
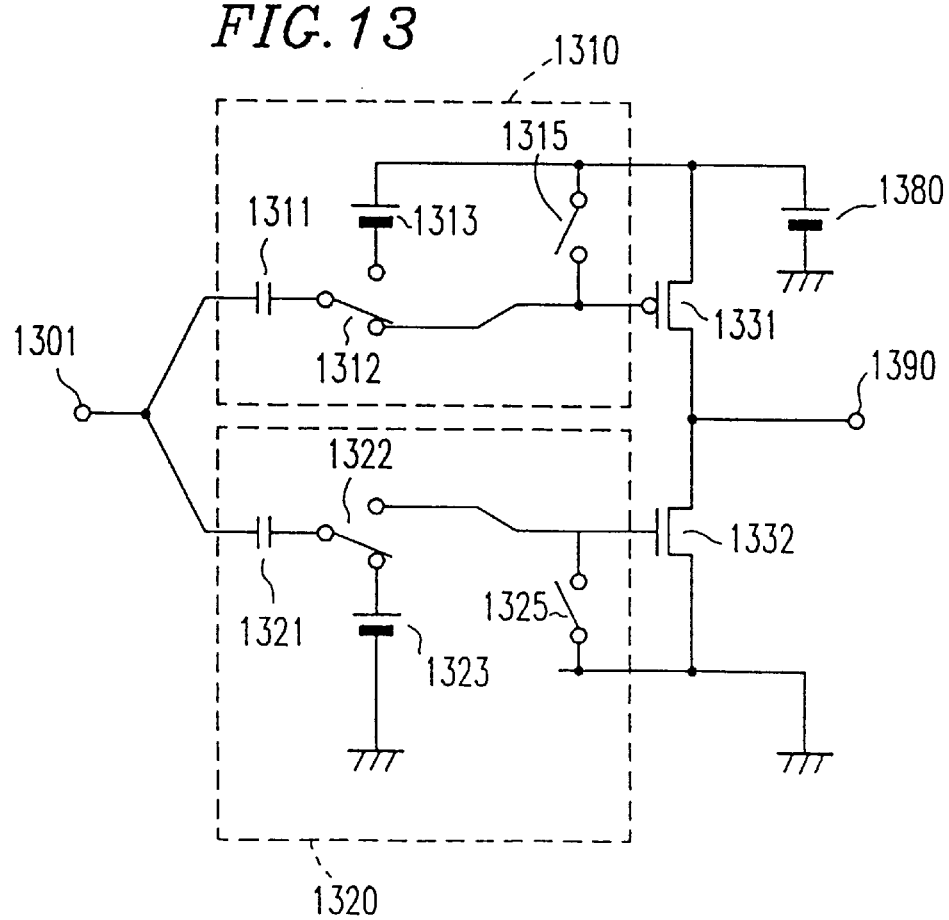
FIG. 13 is a diagram of a fourth example of the logic circuit according to the present invention.

FIG. 13 is a diagram of a fourth example of the logic circuit according to the present invention. The fourth example includes the circuit topology as discussed above with respect to the first example and the second example. Initially, an operation of a voltage converter 1310 and an FET 1331 will be described below. A state wherein the FET 1331 is OFF state is referred to as state I, and a state wherein the FET 1331 is ON state is referred to as state II. In state I, a switch 1312 is placed in a position such that a capacitor 1311 is connected to a voltage generator 1313, and a switch 1315 is placed in a position such that a gate of the FET 1331 is connected to a power supply 1380. In state II, a switch 1312 is placed in a position such that a capacitor 1311 is connected to the FET 1331, and a switch 1315 is placed in a position such that the gate of the FET 1331 is not connected to a power supply 1380. As a result, in state I, the gate of the FET 1331 is supplied with a voltage potential lower than the ground level (i.e., 0V). This voltage potential corresponds to the voltage of the −Vov2 as discussed in the second example.

Next, an operation of a voltage converter 1320 and an YET 1332 will be described below. A state wherein the FET 1332 is OFF state is referred to as state I, and a state wherein the FET 1332 is ON state is referred to as state II. In state I, a switch 1322 is placed in a position such that a capacitor 1321 is connected to a voltage generator 1323, and a switch 1325 is placed in a position such that a gate of the FET 1332 is connected to the ground. In state II, a switch 1322 is placed in a position such that a capacitor 1321 is connected to the FET 1332, and a switch 1325 is placed in a position such that the gate of the FET 1332 is not connected to the ground. As a result, in state II, the gate of the FET 1332 is supplied with a voltage potential higher than the power supply voltage Vdd. This voltage potential corresponds to the voltage of (Vdd+Vov1) as discussed In the first example.

In the fourth example, the power supply 1380 supplying the power supply voltage Vdd, and the power generators 1313 and 1323 are used. The power generators 1313 and 1323 generate a voltage of, for example, Vdd. In place of the power generators 1313 and 1323, the power supply 1380 can be used. In such case, a contact which is connected to a negative electrode of the voltage generator 1313, is connected to the ground; and a contact which is connected to a positive electrode of the voltage generator 1323, is connected to a positive electrode of the power supply 1380. Such circuit topology requires only one kind of the power supply (i.e., power supply 1380). The some is true with respect to the other logic circuits according to the present invention as discussed in the other examples.

Node 1390 is at the L level when node 1301 is at the H level, while Node 1390 is at the H level when node 1301 is at the L level. In other words, the logic circuit shown in FIG. 13 functions as an inverter.

Figure 14:
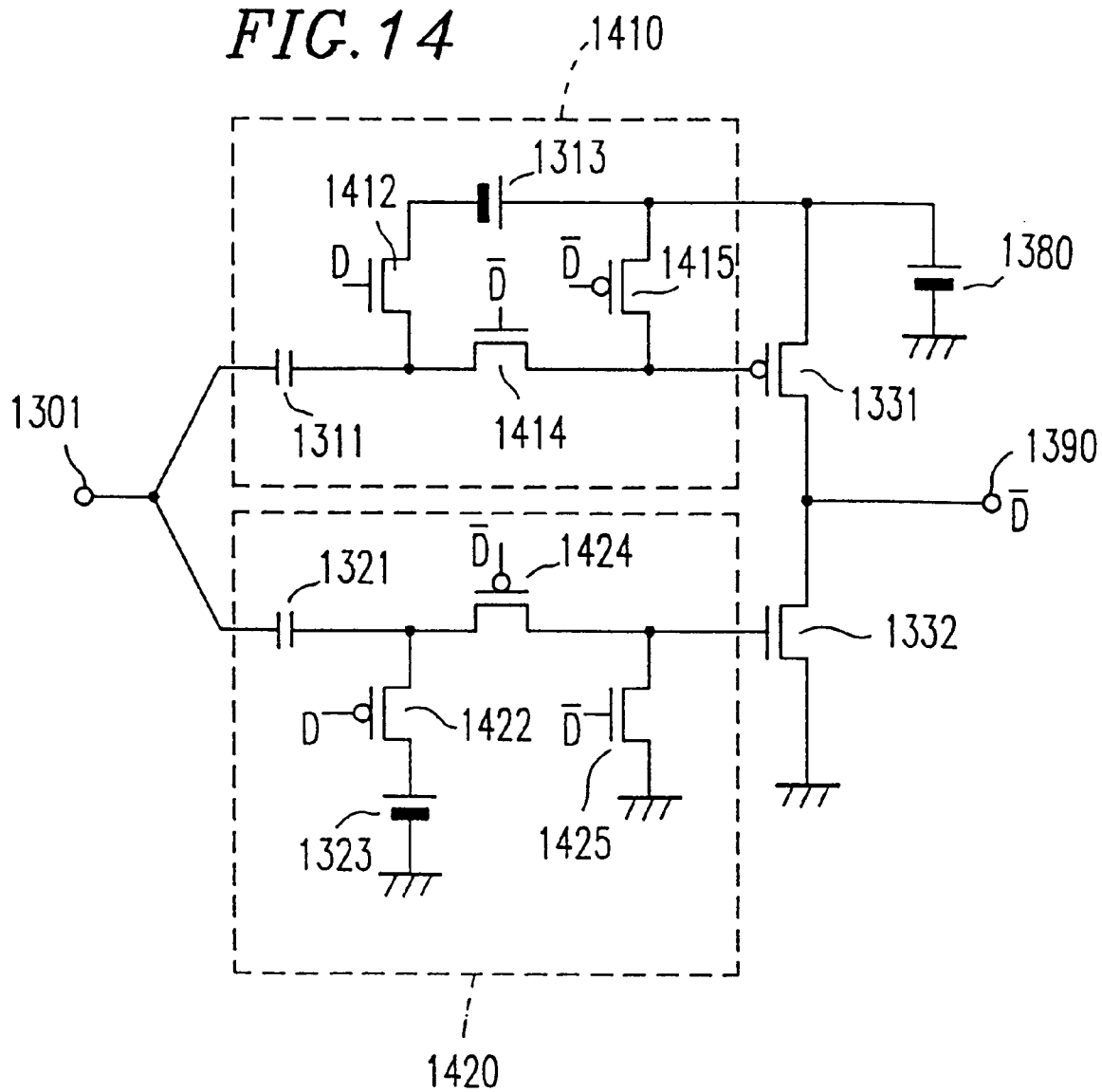
FIG. 14 is a diagram of a logic circuit according to the present invention using FETs as the four switches in FIG. 13.

FIG. 14 is a diagram of a logic circuit accords ing to the present invention using FETs as the four switches in FIG. 13. FETs 1412 and 1414 correspond to the switch 1312, and FETs 1422 and 1424 correspond to the switch 1322. FETs 1415 and 1425 correspond to the switches 1315 and 1325, respectively. The logic circuit shown in FIG. 14 operates in the same manner as discussed referring to FIG. 13. Therefore, further details are omitted.

EXAMPLE 5

Figure 15:
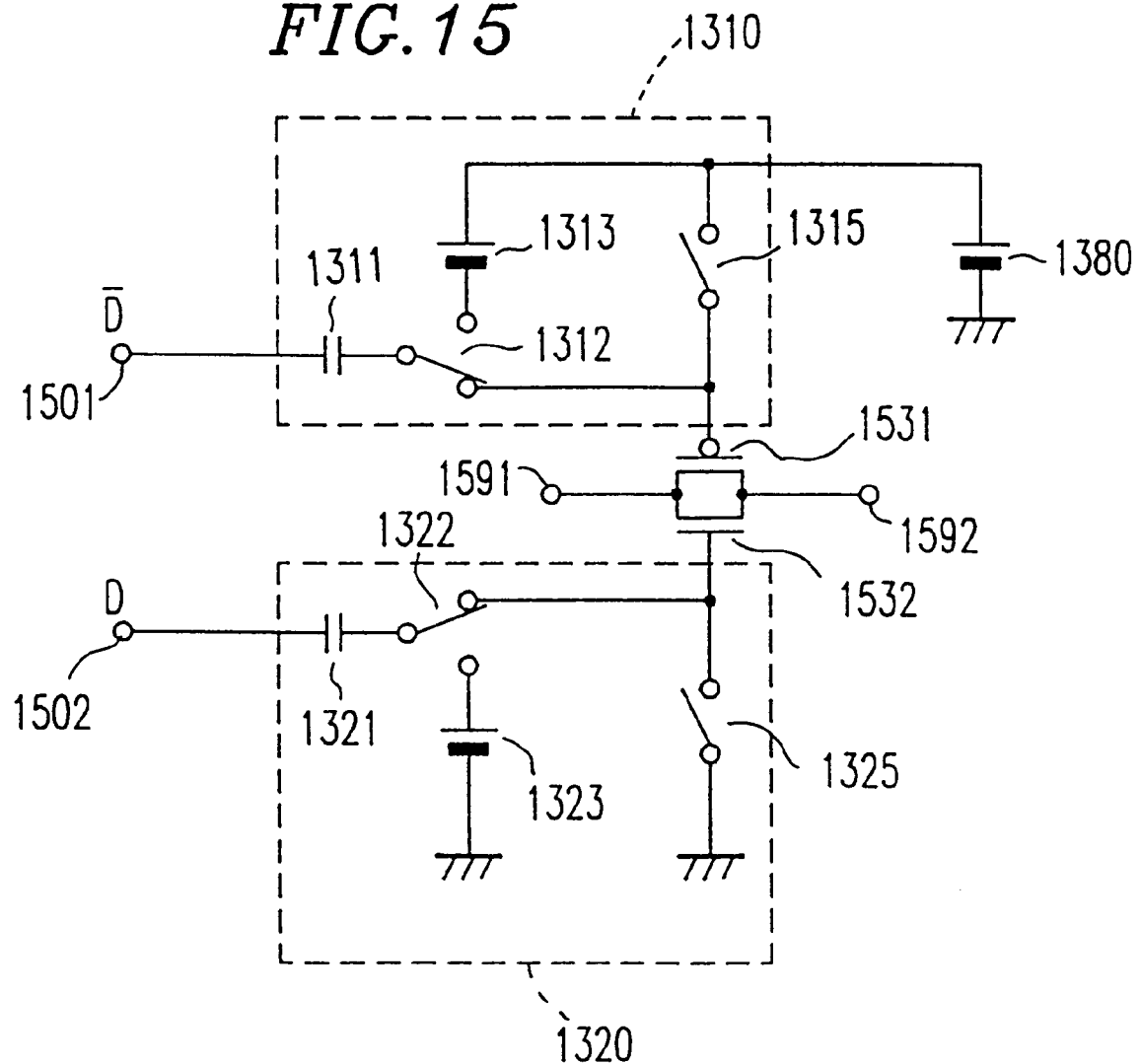
FIG. 15 is a diagram of the fifth example of the logic circuit according to the present invention

FIG. 15 is a diagram of the fifth example of the logic circuit according to the present invention. The logic circuit shown in FIG. 15 has similar configurations to the logic circuit of FIG. 13 with the exception that the FETs 1331 and 1332 are replaced with FETs 1531 and 1532, and that node 1301 is replaced with nodes 1501 and 1502. The switches 1312, 1315, 1322 and 1325 operate in the same manner as discussed above with respect to FIG. 13.

Assuming that node 1502 receives an input signal D, node 1501 receives D bar as an input signal. FETs 1531 and 1532 turn on and turn off simultaneously, thereby changing conduction state between nodes 1591 and 1592. For example, when nodes 1501 and 1502 are at the L level and the H level, respectively, the FETs 1531 and 1532 are ON state. On the other hand, when nodes 1501 and 1502 are at the H level and the L level, respectively, the FETs 1531 and 1532 are OFF state. In other words, in the fifth example, the logic circuit according to the present invention is applied to a transfer gate.

Figure 16:
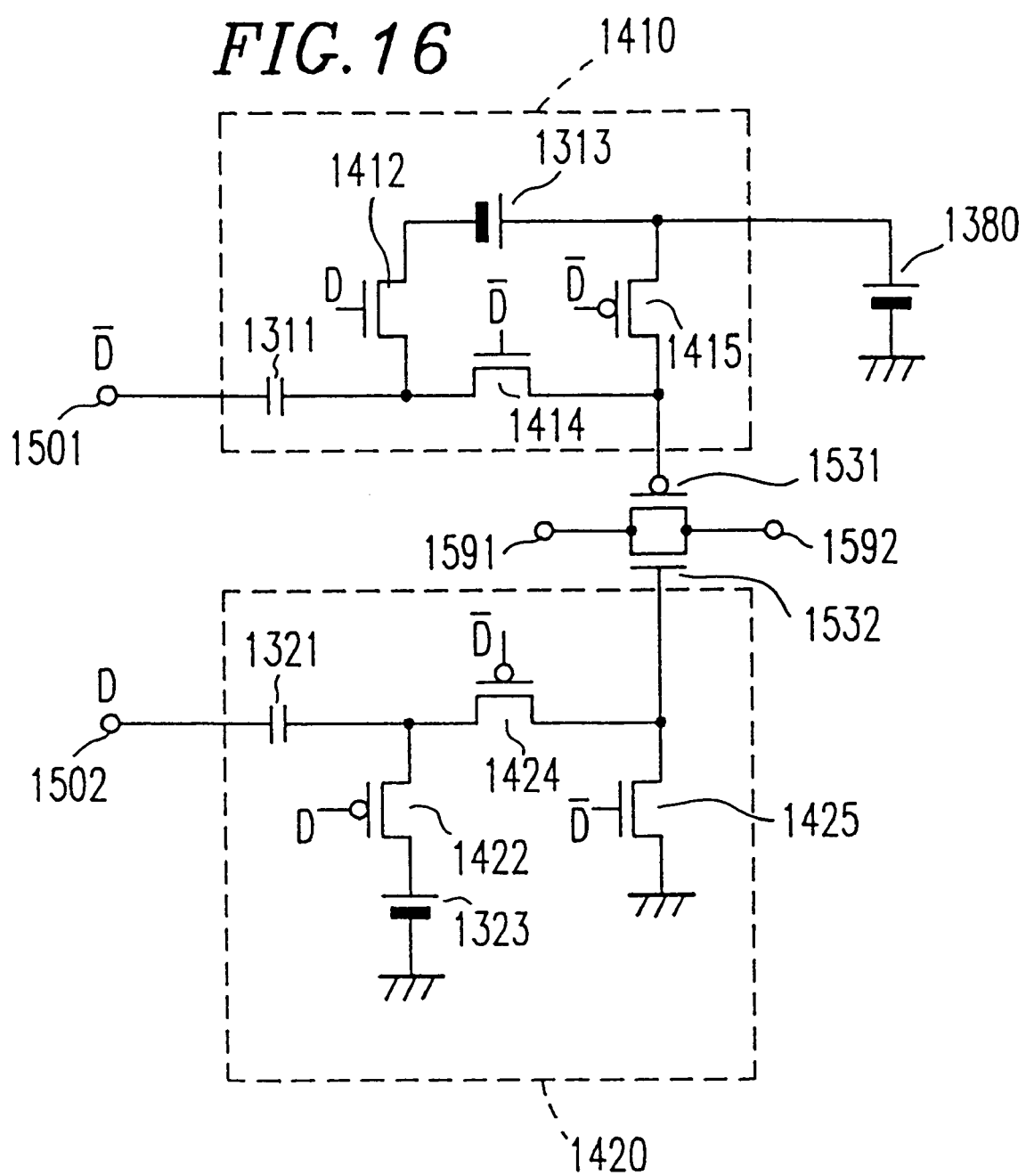
FIG. 16 is a diagram of a logic circuit according to the present invention using FETs as the four switches in FIG. 15.

FIG. 16 is a diagram of a logic circuit according to the present invention using FETs as the four switches in FIG. 15. The logic circuit shown in FIG. 16 operates in the same manner as discussed referring to FIG. 15. Therefore, further details are omitted.

EXAMPLE 6

Figure 17:
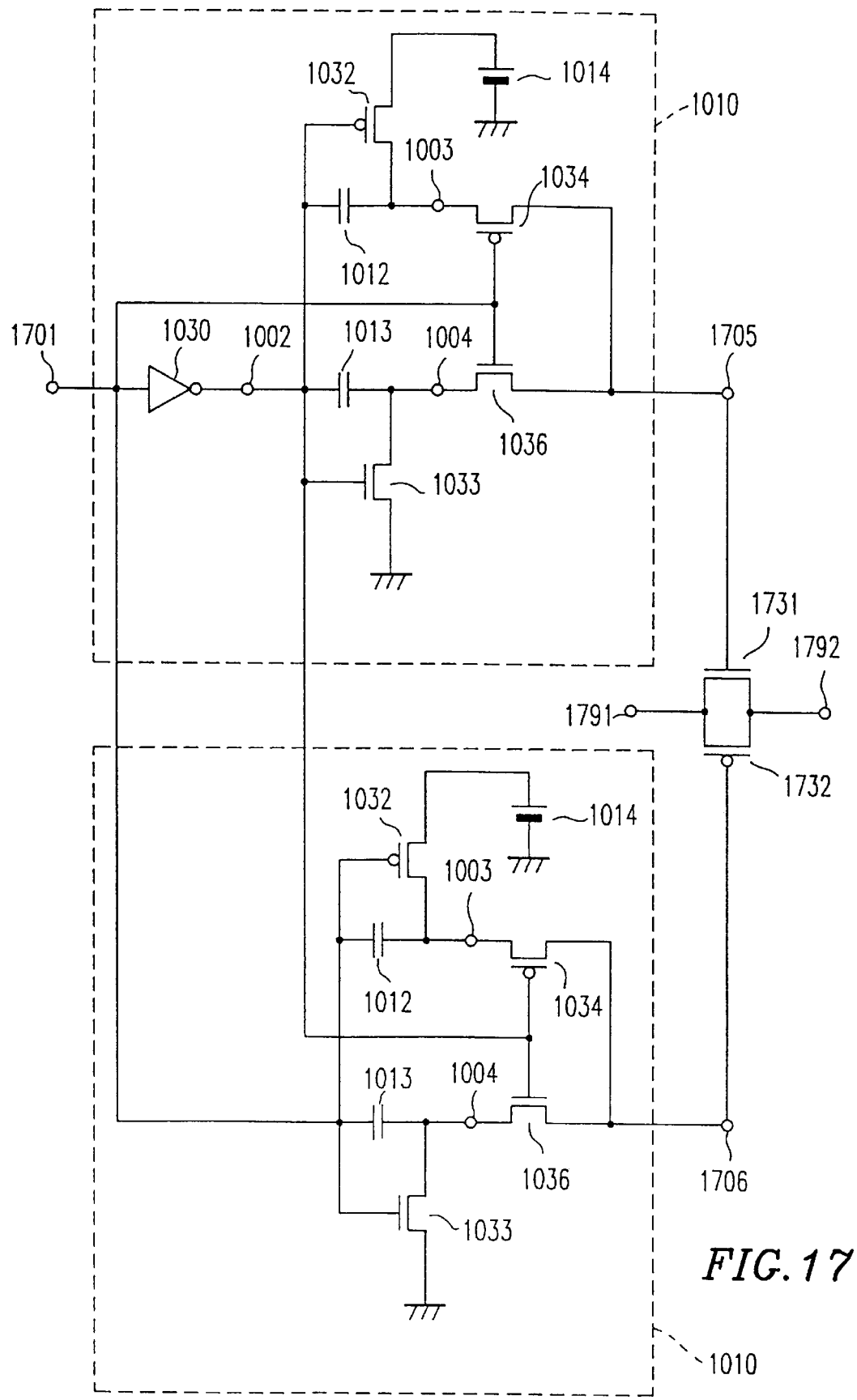
FIG. 17 is a diagram of a sixth example of the logic circuit according to the present invention.

FIG. 17 is a diagram of a sixth example of the logic circuit according to the present invention. In the logic circuit shown in FIG. 17, the voltage converter 1010 in the third example described with respect to FIG. 10 driven FETs 1731 and 1732. When node 1701 is at the L level, voltages of nodes 1705 and 1706 are (Vdd+Vov1) and −Vov2, respectively, whereby nodes 1791 and 1792 are conduction state. When node 1701 is at the H level, voltages of nodes 1705 and 1706 are −Vov2 and (Vdd+Vov1), respectively, whereby nodes 1791 and 1792 are in a non-conduction state.

According to the sixth example of the present invention, when FETs 1731 and 1732 are OFF state, nodes 1705 and 1706 are respectively supplied with −Vov2 and (Vdd+Vov1). This results in complete turn-off of the FETs. Moreover, an FET having a lower threshold voltage Vt can be used, resulting in lower operation voltage.

EXAMPLE 7

Figure 18:
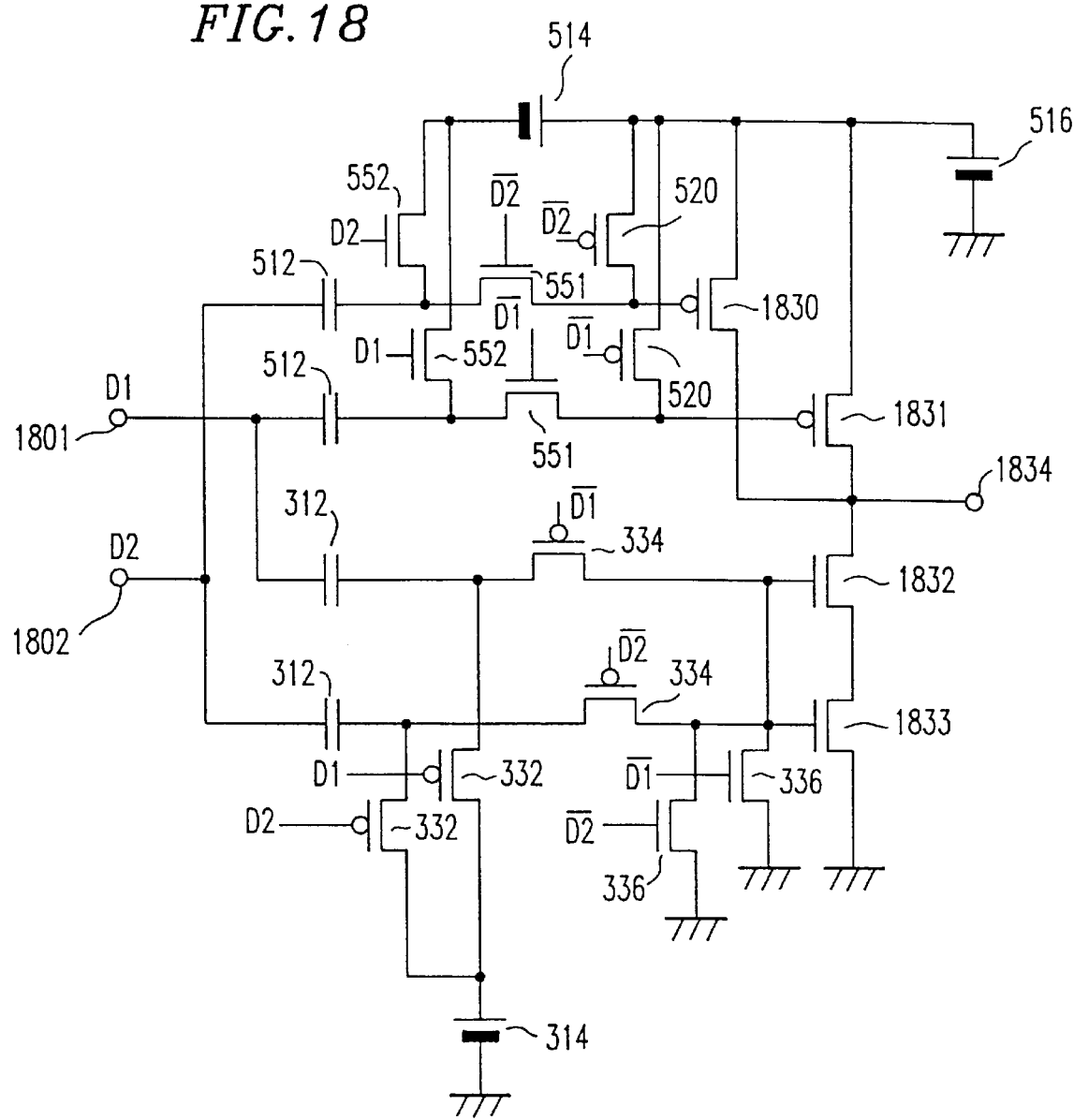
FIG. 18 is a diagram of a seventh example of the logic circuit according to the present invention.

FIG. 18 is a diagram of a seventh example of the logic circuit according to the present invention. The logic circuit in FIG. 18 receives D1 and D2 as inputs at nodes 1801 and 1802, performs a NAND operation and outputs the operation results to node 1834. In other words, only when both of nodes 1801 and 1802 are at the L level, node 1834 will become the H level. FETs 1830 and 1831 are driven by the voltage converter shown in FIG. 5B. FETs 1832 and 1833 are driven by the voltage converter shown in FIG. 3. As a result, a capability for driving the main switching devices is enhanced, thereby enabling higher operations at a lower voltage.

EXAMPLE 8

Figure 19:
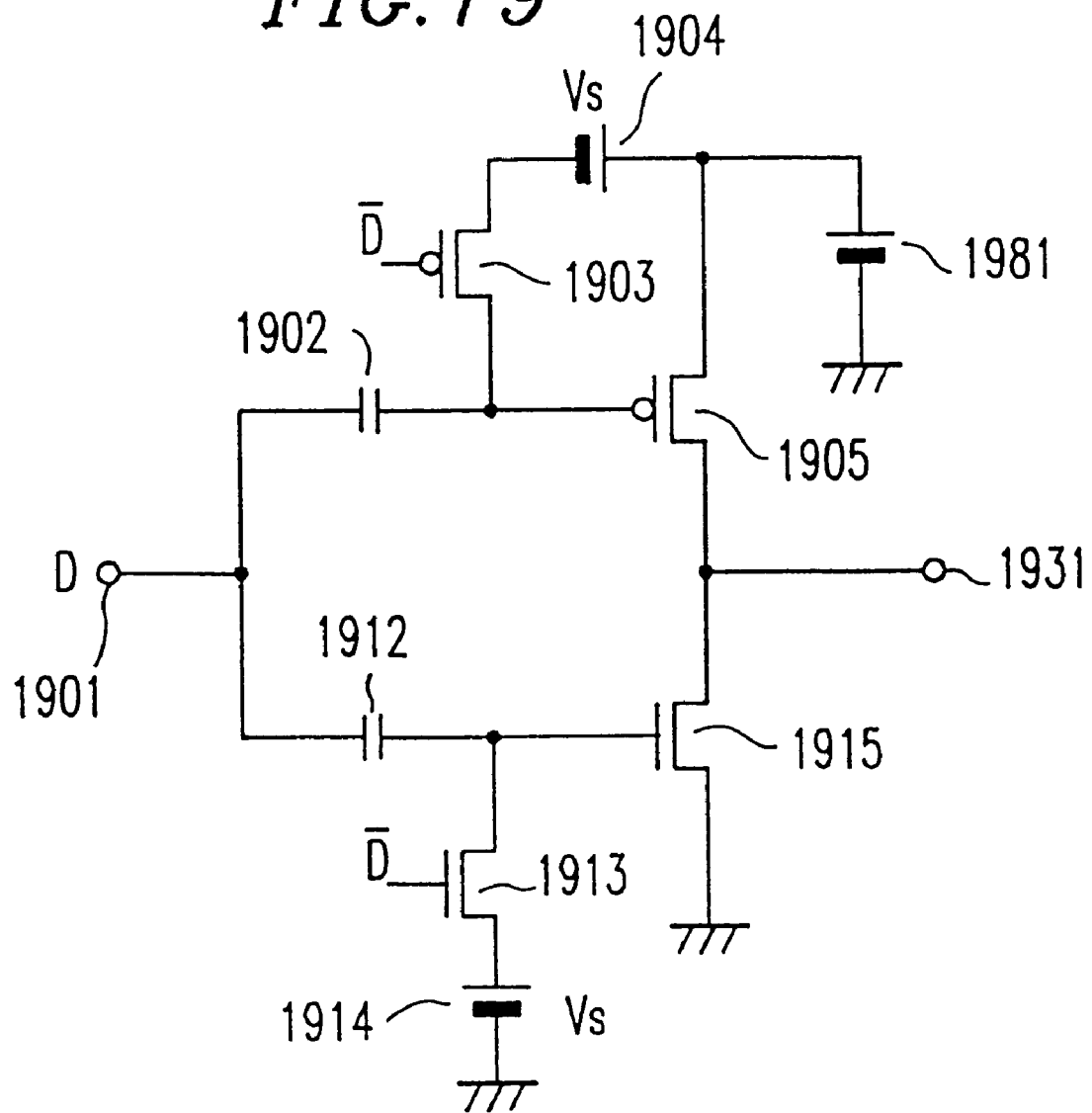
FIG. 19 is a diagram of a eighth example of the logic circuit according to the present invention.

FIG. 19 is a diagram of a eighth example of the logic circuit according to the present invention. The operation of the logic circuit of the eighth example is described below. When node 1901 is at the H level, an FET 1903 is ON state, an FET 1913 is OFF state. Therefore, an FET 1915 is ON state and an FET 1905 is OFF state, whereby node 1931 is at the L level. Assuming that a voltage generator 1904 generates a voltage of Vs, a voltage supply 1981 supplies a power supply voltage Vdd, and node 1901 is supplied with a voltage of Vdd, a capacitor 1902 is charged by a voltage of (Vdd−Vs). A gate of the FET 1916 is supplied with a summation of a voltage of node 1901 (i.e., H level) and a voltage due to electric charge in a capacitor 1912 (described later).

When node 1901 is at the L level, an FET 1903 is OFF state, an FET 1913 is ON state. Therefore, an FET 1915 is OFF state and an FET 1905 is ON state, whereby node 1931 is at the H level. Assuming that a voltage generator 1914 generates a voltage of Vs, a voltage supply 1981 supplies a power supply voltage Vdd, and node 1901 is at the ground level, a capacitor 1902 is charged by a voltage of −Vs. A gate of the FET 1905 is supplied with a summation of a voltage of node 1901 (i.e., L level) and voltage due to electric charge in a capacitor 1902.

In both of above cases, a gate of any ON-state FET of the FETs 1905 and 1915 is supplied with a higher voltage than Vdd, and a gate of any OFF-state FET of the FETs 1905 and 1915 is supplied with a lower voltage than the ground level. As a result, the operation speed at a low operation voltage can be improved. The eighth example utilizes a simple circuit configuration, resulting in reduction of a chip area in an integrated circuit.

In the first to the eighth examples of the logic circuit according to the present invention, an SOI FET is preferably used as an FET in the voltage converter for the reasons discussed below. FIG. 20 is a diagram illustrating a structure of an N-channel MOS FET and its equivalent circuit. FIG. 21 is a diagram illustrating a structure of a P-channel MOS FET and its equivalent circuit. A MOS FET, as shown in FIGS. 20 and 21, has a junction capacitor CJ and diodes between the drain and the backgate, and between the source and the backgate.

Figure 22A:
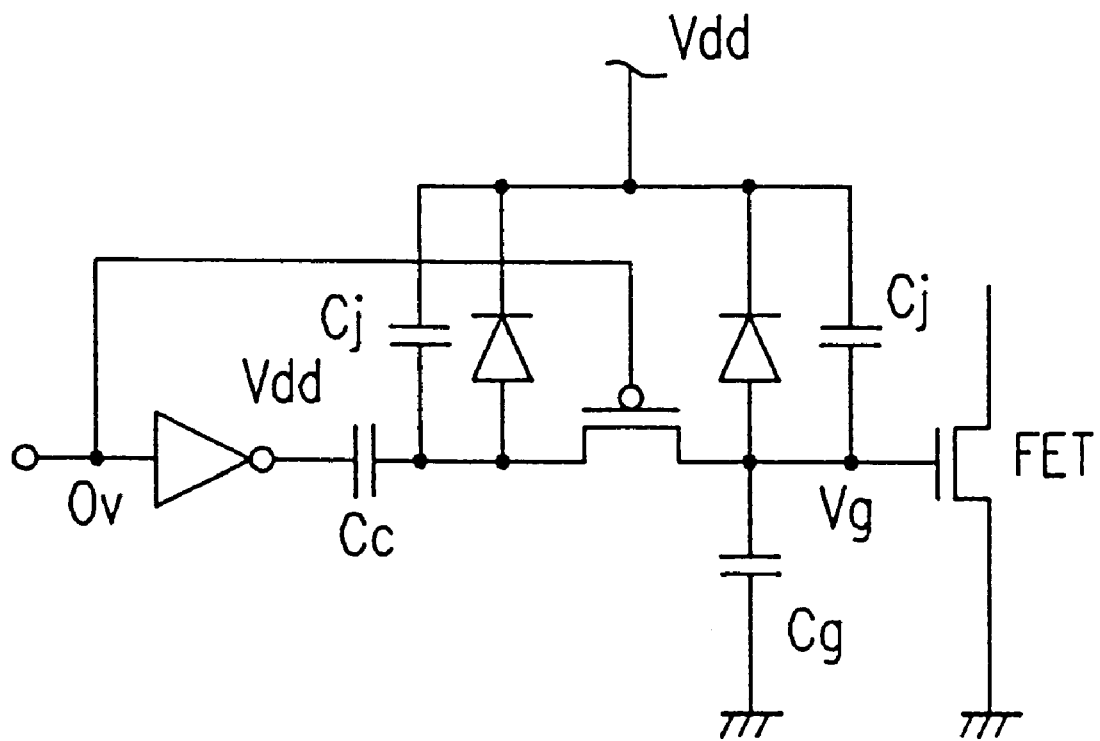
FIG. 22A is a diagram illustrating a part of the first example of the logic circuit.
Figure 22B:
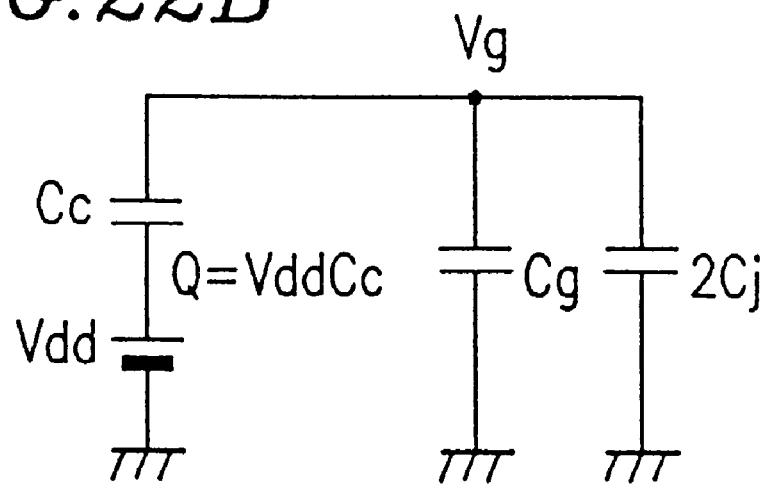
FIG. 22B is a diagram illustrating a equivalent circuit shown in FIG. 22A.

FIG. 22A in a diagram illustrating a part of the first example of the logic circuit, and FIG. 22B is a diagram illustrating a equivalent circuit shown in FIG. 22A. It is assumed that one terminal of terminals of a capacitor Cc, which is not dotted, is pulled up to Vdd after the capacitor Cc is supplied with a voltage of Vdd. A gate voltage Vg will be represented below using a junction capacitance Cj and a gate capacitance Cg after electric charge is re-distributed. Electric charge of Q=VddCc in the initial state is equal to summation of electric charge (Vg−Vdd)Ca charged by the capacitance Cc and electric charge Vg(Cg+2Cj) charged by the capacitance (Cg+2Cj) after the re-distribution, resulting in the following expression:

$$VddCc=(Vg-Vdd)Cc+Vg(Cg+2Cj).$$

Solving for the gate voltage Vg yields:

$$Vg=2CcVdd/(Cc+Cg+2Cj).$$

Therefore, in case of Cc>>Cg+2Cj, the advantage of the present invention can be maximized. On the contrary, In case of Cc<<Cg+2Cj, the advantage of the present invention is not so remarkable. Accordingly, setting circuit constants such that Cc>>Cg+2Cj is satisfied is preferable. The smaller the junction capacitance Cj, the more remarkable the advantage of the present invention will become.

In case of Vg≧Vdd+Vf, where Vf represents a forward direction voltage, a current flows through the parasitic diodes, whereby the voltage Vg is clamped at Vg=Vdd+Vf. As a result, the gate voltage Vg cannot be pulled up higher than this clamped voltage.

Using a transistor having an SOI structure resolves the above problem due to the junction capacitance and the parasitic diode, maximizing the advantages of the present invention. FIG. 23 is a diagram illustrating a structure of an N-channel transistor and a P-channel transistor both having an SOI structure.

Further reasons of high-speed operation enabled in the logic circuit according to the present invention are discussed in detail below. In general, a drain current Id of an FET can be expressed using the following expression:

$$Id=\beta(Vgs-Vt)^\alpha,$$

where α=1.4–2.0, β: a constant, Vgs: gate-source voltage, Vt: threshold voltage. A delay time τd of the logic circuit is expressed as follows:

$$\tau d=\gamma CLVdd/Id=\gamma CLVdd/(\beta(Vgs-Vt)^\alpha),$$

where γ: a constant, CL: a capacitance of a load. Assuming that an operation speed of a system using the logic circuit is in proportional with 1/τd, and that α=2 for the sake of simplicity, the speed f of the system is expressed as follows:

$$f=1/\tau d=(\beta/(\gamma CL))*((Vgs/Vdd)^2-2Vt(Vgs/Vdd)-(Vt/Vdd)^2),$$

where Vgs=ηVdd, η=1+Vov1/Vdd (>1.0). If $(Vt/Vdd)^2<<1$ is assumed, then $$f=(\beta/(\gamma CL))*(\eta^2-2V t\eta)=\beta\eta(\eta-2Vt)/(\gamma CL).$$

Therefore, high operation speed of the system requires a large η and a small Vt.

On the other hand, a leak current Idleak is expressed as follows;

$$Idleak=\lambda w*10^{(Vgs-Vt)/s},$$

where γ: a constant, w: a gate width of a transistor, and S is about 70 mV. Substituting Vgs=0 yields $$Idleak=\lambda w*10^{(-Vt/s)}.$$

As will be appreciated from the above expression, a small leak current Idleak requires a large threshold voltage Vt.

According to the present invention, the voltage converter increases a voltage supplied to the gate, whereby η will become large, and the operation speed will be enhanced at an ordinary threshold voltage Vt (i.e., about 0.5 V). Moreover, when the main switching device is OFF state, the gate is at the ground level, thereby suppressing the leak current.

Furthermore, in the third example, when the main switching device is OFF state, the gate voltage is −Vov2. In such case, the leak current Idleak is equal to $\lambda w*10^{(-Vov2-Vt/s)}$. As a result, −Vov2 is about −0.3 V, while Vt is equal to or less than 0.35 V, thereby sufficiently suppressing the leak current Idleak. This means that a transistor having a lower Vt can be used as the main switching device. Therefore, increased drive current due to the small Vt overdrives the device, whereby a remarkable advantage of the high operating speed according to the present invention.

Figure 24A:
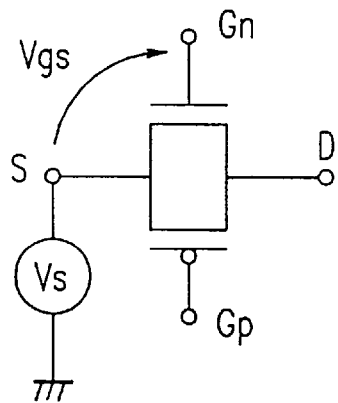
FIG. 24A is a diagram illustrating a transfer gate type switch.
Figure 24B:
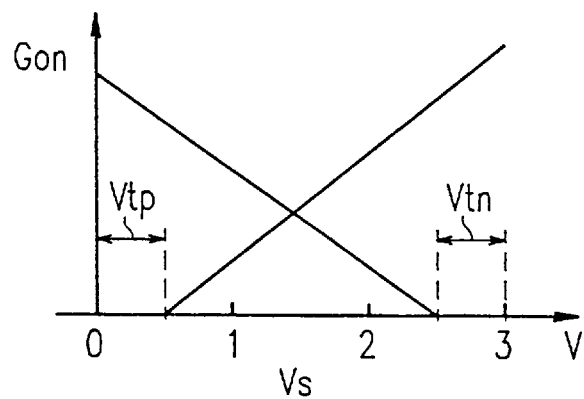
FIG. 24B Is a graph showing a conductance Gon between a drain and a source of the transfer gate as a function of a source voltage Vs.
Figure 25:
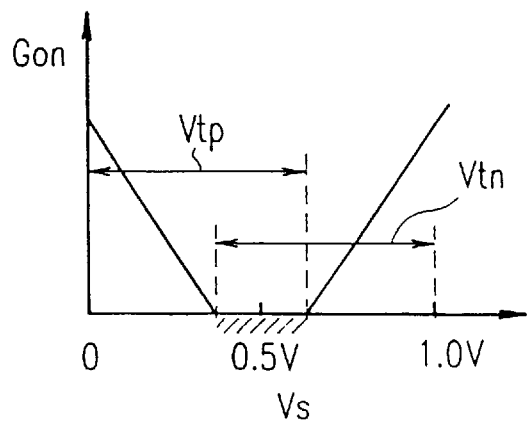
FIG. 25 is a graph showing a conductance Gon between a drain and a source of the transfer gate as a function of a source voltage Vs when the source voltage is low.

An advantage of the present invention when the logic circuit of the invention is applied to a transfer gate type switching device will be discussed below. FIG. 24A is a diagram illustrating a transfer gate type switch, and FIG. 24B is a graph showing a conductance Gon between a drain and a source of the transfer gate as a function of a source voltage Vs. In FIG. 24B, Vtn and Vtp are threshold voltages of an N-channel FET and a P-channel FET, respectively. As shown in FIG. 24A, in the transfer gate type switch, voltage potentials of the source and the drain are not fixed. Therefore the source voltage could be equal to the power supply voltage Vdd. In such case, in order to turn-on the FET, a voltage higher then (Vdd+Vt) will be necessary. This means that the transfer gate needs a higher voltage than an ordinary logic gate. FIG. 25 is a graph showing a conductance Gon between a drain and a source of the transfer gate as a function of a source voltage Vs when the source voltage is low. When the source voltage is about 1.0 V, both of the two complementary FETs do not turn-on in a certain region of the source voltage (see hatched region in FIG. 25). The voltage converter of the logic circuit according to the present invention outputs a voltage higher than the power supply voltage Vdd to the gate of the main switching device, and provides deep backward bias to Vgs when the threshold voltage Vt of the main switching device is low. As a result, high speed operation at a low operation voltage is possible according to the present invention.

Figure 26:
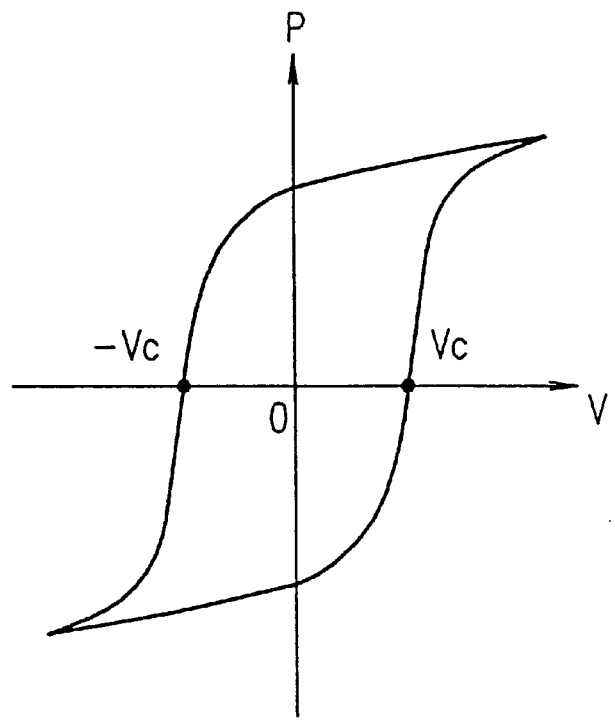
FIG. 26 is a graph showing a polarization of the capacitor of which insulating material is high dielectric constant material as a function of a supplied voltage.

In the first to the eighth example, a capacitor using a material having a high dielectric constant can be used as the voltage generator and the capacitor in the voltage converter. FIG. 26 is a graph showing a polarization of the capacitor of which insulating material is high dielectric constant material as a function of a supplied voltage. The capacitor using the high dielectric constant material shows polarization characteristics of FIG. 26. When a voltage supplied to the capacitor using the high dielectric constant material exceeds a coercive voltage Vc, spontaneous polarization will occur. As a result, the capacitor using the high dielectric constant material retains a certain voltage without an external voltage supply. Also, since its dielectric constant is extremely large, a small area provides a large capacitance. Therefore, a voltage drop due to the charge re-distribution is small. Applying this capacitor using the high dielectric constant material to the logic circuit according to the present invention realizes efficient operation: a high speed operation at a low voltage.

Figure 27:
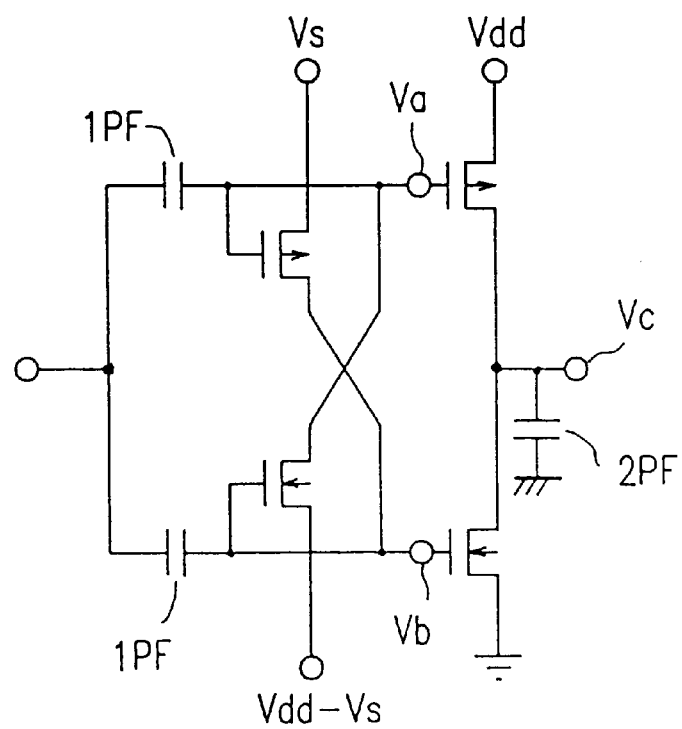
FIG. 27 is a circuit diagram of a logic circuit of the prior art to be compared.
Figure 28A:
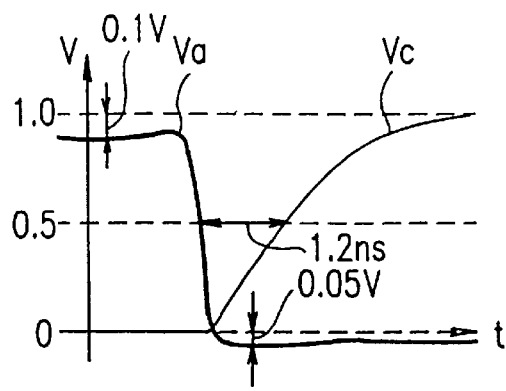
Figure 28B:
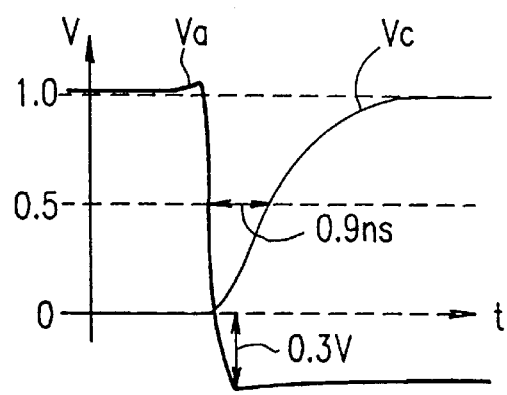
Figure 28C:
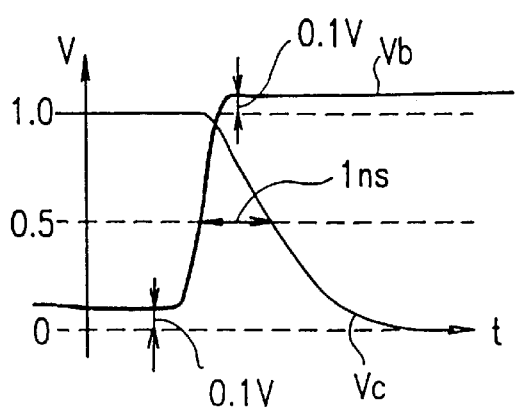
FIGS. 28C and 28D are graphs showing voltages Vb and Vc of the logic circuit of the prior art, and voltages Vb and Vc of the logic circuit of the present invention, respectively at the falling edge of the output signal.
Figure 28D:
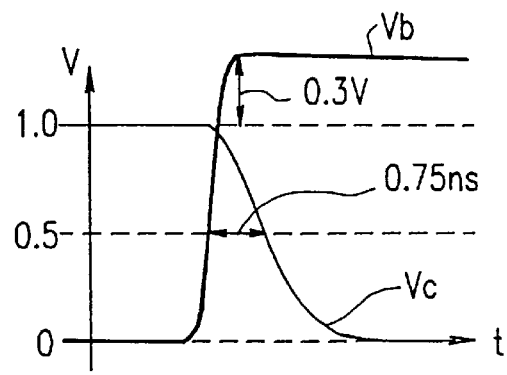

A comparison of the logic circuit according to the present invention shown in FIG. 14 to the logic circuit of the prior art will be discussed. FIG. 27 is a circuit diagram of a logic circuit of the prior art to be compared. FIGS. 28A and 28B are graphs showing voltages Va and Vc of the logic circuit of the prior art, and voltages Va and Vc of the logic circuit of the present invention, respectively at the rising edge of the output signal. FIGS. 28C and 28D are graphs showing voltages Vb and Vc of the logic circuit of the prior art, and voltages Vb and Vc of the logic circuit of the present invention, respectively at the falling edge of the output signal. In FIGS. 28A–28D, the power supply voltage Vdd is 1.0 V. Referring to FIG. 28A, according to the prior art, when the main switching device is OFF state, the voltage Va is lower than the power supply voltage Vdd by 0.1 V. As a result, when the main switching device is OFF state, a leak current flows. When the main switching device is ON state, Va is equal to −0.05 V. This results in insufficient drive capability. In FIG. 28A, the gate delay time is 1.2 ns.

On the other hand, referring to FIG. 28B, when the main switching device in the present invention is OFF state, Va is equal to Vdd. Therefore, the leak current does not exist. Moreover, when the main switching device is ON state, Vs is equal to −0.3 V. This means the enhanced drive capability of the present invention. Referring to FIG. 28B, the gate delay time is 0.9 ns.

Referring to FIG. 28C, in the prior art, Vb is equal to 0.1 V when the main switching device is OFF state, generating the leak current. Vb is higher than Vdd by only 0.1 V when the main switching device is ON state. Therefore, the drive power is not sufficient. The gate delay time is 1.0 ns.

On the other hand, referring to FIG. 28D, Vb is equal to 0 V when the main switching device is OFF state. Therefore, the leak current does not flow. Vb is higher than Vdd by 0.3 V, resulting in high drive power. The gate delay time is equal to 0.75 ns.

Figure 29:
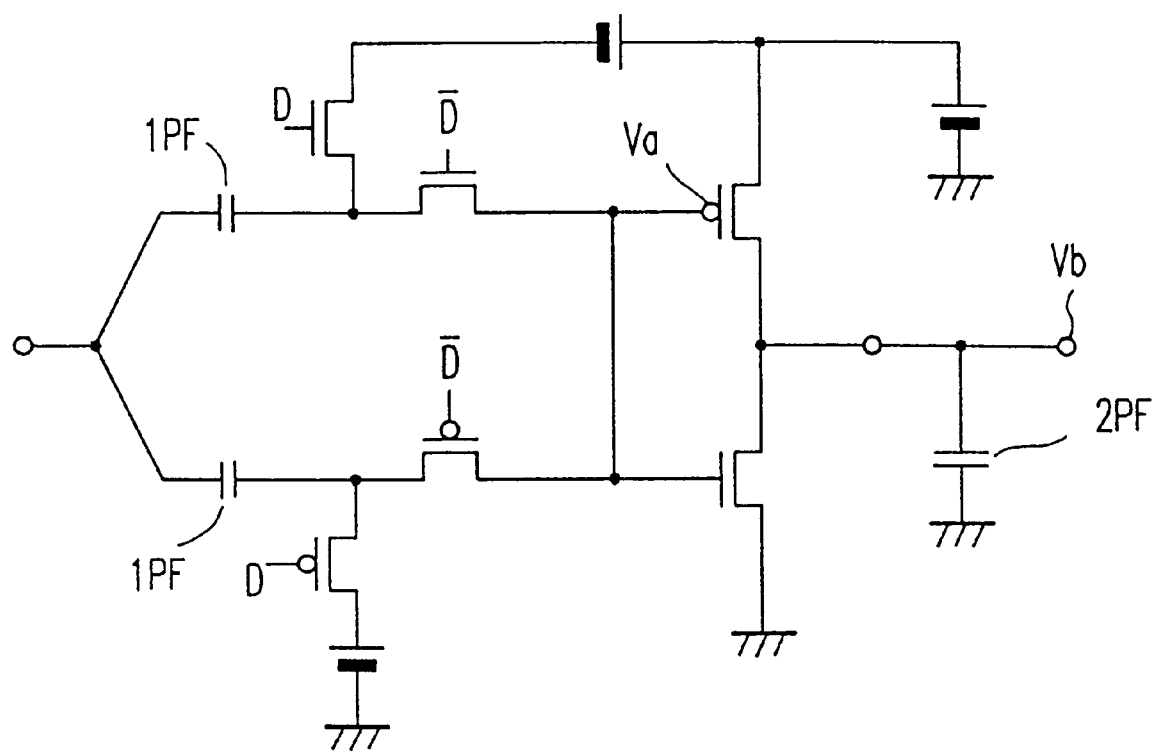
FIG. 29 is a circuit diagram of the logic circuit of the present invention.
Figure 30A:
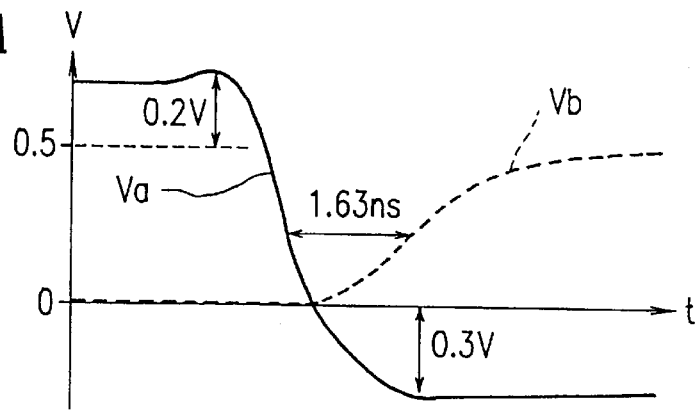
FIG. 30A is a graph showing voltages Va and Vb of the logic circuit of the present invention at the rising edge of the output signal.
Figure 30B:
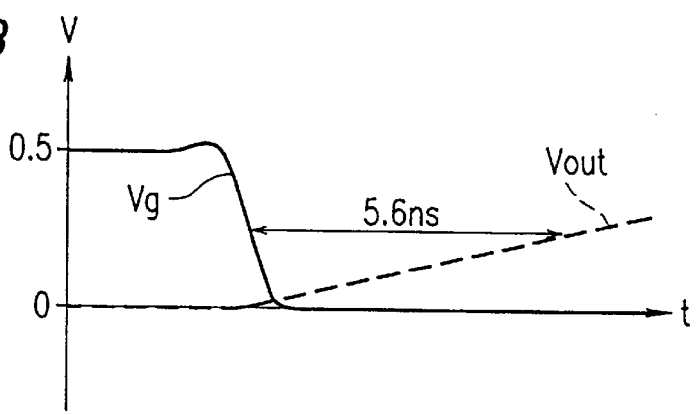
FIG. 30B is a graph showing a gate voltage Vg of the main switching device and an output voltage Vout of the logic circuit of the prior art at the rising edge of the output signal.
Figure 30C:
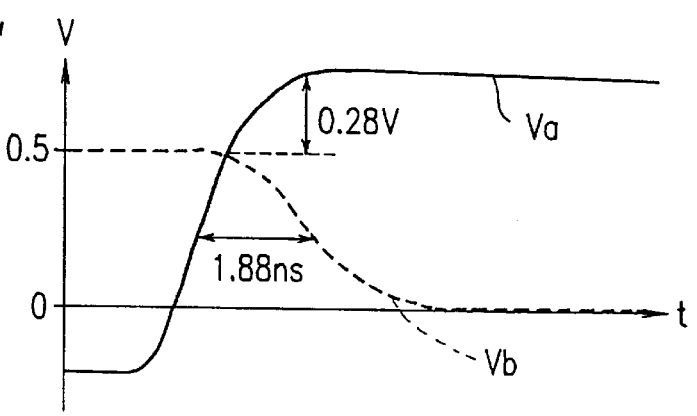
FIG. 30C is a graph showing voltages Va and Vb of the logic circuit of the present invention at the falling edge of the output signal.
Figure 30D:
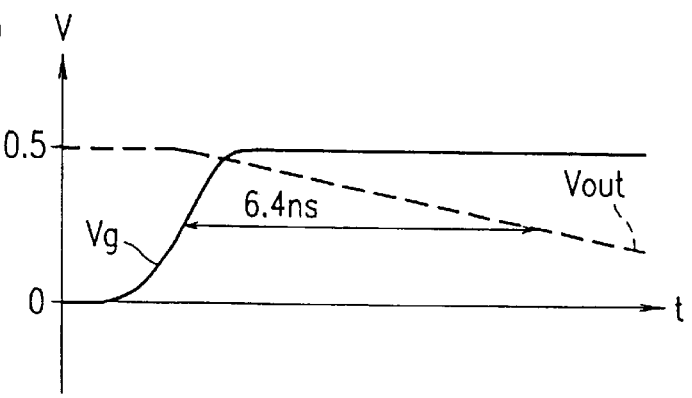
FIG. 30D is a graph showing a gate voltage Vg of the main switching device and an output voltage Vout of the logic circuit of the prior art at the falling edge of the output signal.
Figure 31:
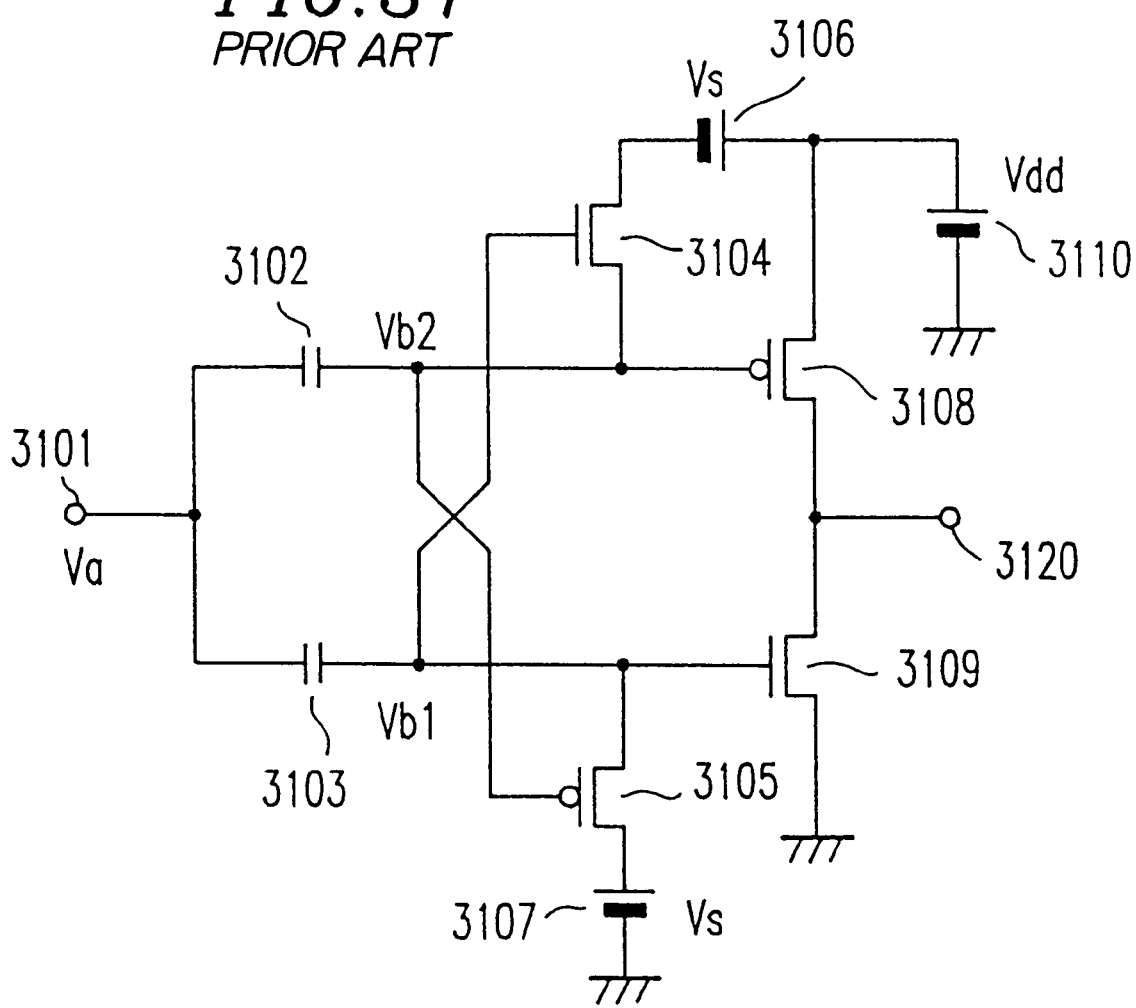
FIG. 31 is a diagram of a logic circuit of the prior art.

A comparison of the logic circuit according to the present invention shown in FIG. 29 to the logic circuit of the prior art will be discussed. FIG. 29 is a circuit diagram of the logic circuit of the present invention. As a logic circuit of the prior art, an ordinary complementary MOS inverter is used to be compared. A voltage of 0.5 V as the power supply voltage Vdd is used for the logic circuit of the present invention and the prior art. FIG. 30A is a graph showing voltages Va and Vb of the logic circuit of the present invention at the rising edge of the output signal. FIG. 30B is a graph showing a gate voltage Vg of the main switching device and an output voltage Vout of the logic circuit of the prior art at the rising edge of the output signal. FIG. 30C is a graph showing voltages Va and Vb of the logic circuit of the present invention at the falling edge of the output signal. FIG. 30D is a graph showing a gate voltage Vg of the main switching device and an output voltage Vout of the logic circuit of the prior art at the falling edge of the output signal.

Referring to FIG. 30A, Va is higher than Vdd by 0.5 V when the main switching device is OFF state, whereby the main switching device is deeply cut off. Va is lower than the ground level by 0.3 V, whereby the drive capability is enhanced. The gate delay time is 1.63 ns. On the other hand, as shown in FIG. 30B, the gate delay time of the prior art is 5.6 ns.

Referring to FIGS. 30C and 30D, also at the falling edge, the gate delay time of the prevent invention is smaller than that of the prior art. Specifically, the gate delay time of the present invention is only 1.88 ns, while the gate delay time of the prior art is 6.4 ns.

As will be apparent from the above described simulation result, the logic circuit according to the present invention enables enhancing the operation speed especially in the low operation voltage region.

In the first to the eighth example, a terminal which is not connected to the node receiving the input signal can be set to a voltage other than the power supply voltage of Vdd and the ground level. For example, in FIG. 13, the voltage generators 1313 and 1323 are provided in addition to the power supply 1380. A voltage which is generated by the voltage generators 1313 and 1323 is not limited to Vdd. Alternatively, the power supply 1380 can be used in place of the voltage generators 1313 and 1323. Specifically, the contact, which is connected to the negative electrode of the voltage generator 1313, can be connected to the ground, and the contact, which is connected to the positive electrode of the voltage generator 1323, can be connected to the positive electrode of the power supply 1380. As will be appreciated, this modification of the above voltage potential is within the scope of the present invention.

In the logic circuit according to the present invention, a terminal other than the control terminal (i.e., is drain or a source in case of an FET) can be pulled up when necessary. For example, although in FIG. 2A, node 222 of the main switching device 220 is in a floating state, node 222 can be pulled up to the power supply voltage Vdd in an actual circuit. Alternatively, without connecting node 223 to the ground, nodes 222 and 223 can be used as output terminals.

In the logic circuit according to the present invention, a drain voltage and a source voltage of an FET included in the voltage converter are forward direction voltages with respect to a substrate of the transistor. When the power supply voltage is equal to or lower than 1.0 V, however, the drain voltage and the source voltage do not cause a deep forward bias. Moreover, this forward bias can be avoided if the substrate of each transistor is controlled such that, for example, a substrate of a P-channel MOS FET (i.e., an N-well) is at a higher voltage potential then the power supply voltage, and a substrate of a N-channel MOS FET (i.e., a P-well) is at a lower voltage potential than the ground. Also, floating the substrate using the SOI technology will avoid the forward bias. In general, as the voltage of the drain or the source will be at a higher voltage with respect to the transistor substrate, a voltage is supplied between the drain and the source when the transistor constituting the switching circuit is OFF state, thereby causing an off-leak current between the drain and the source. In the logic circuit according to the present invention, transistors for switching are used, and a gate width thereof is small. Therefore, the present invention does not suffer from the problem due to the off-leak current. Alternatively, the off-leak current can be avoided by setting the threshold voltage to a high value.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:
1. A logic circuit comprising:
   a main switching means for changing conduction state between at least two terminals in accordance with a voltage supplied to a control terminal; and a voltage converting means for converting a voltage at an input terminal and outputting the converted voltage to the control terminal, the voltage converting means including a voltage generating means and a sub switching means, wherein the state of the logic circuit is either a first state in which the main switching means is non-conductive or a second state in which the main switching means is conductive, and wherein, in the first state, the voltage converting means converts the voltage at the input terminal into a converted voltage at which the main switching means is cut off sufficiently, and particularly the voltage converting means converts the voltage at the input terminal into the converted voltage which is outputted to the control terminal, the converted voltage being operative to drive the main switching means further into a non-conductive state as compared to if the voltage at the input terminal itself was outputted to the control terminal, the voltage generating means includes a capacitor of which a first terminal is connected to the input terminal; and the sub switching means:
 connects a second terminal of the capacitor to the control terminal of the main switching means in the first state; and
 connects the first terminal of the capacitor to the control terminal of the main switching means, and connects the second terminal of the capacitor to a around in a state other than the first state.

2. A logic circuit comprising:

a main switching means for changing conduction state between at least two terminals in accordance with a voltage supplied to a control terminal; and a voltage converting means for converting a voltage at an input terminal and outputting the converted voltage to the control terminal, the voltage converting means including a voltage generating means and a sub switching means, wherein the state of the logic circuit is either a first state in which the main switching means is non-conductive or a second state in which the main switching means is conductive, and wherein, in the first state, the voltage converting means converts the voltage at the input terminal into a converted voltage at which the main switching means is cut off sufficiently, the voltage generating means includes a capacitor of which a first terminal is connected to the input terminal; and the sub switching means:
 connects a second terminal of the capacitor to the control terminal of the main switching means in the first state; and
 connects the first terminal of the capacitor to the control terminal of the main switching means, and connects the second terminal of the capacitor to a ground in a state other than the first state.

3. A logic circuit according to claim 2, wherein the main switching means includes an N-channel MOS FET.

4. A logic circuit according to claim 2, wherein the main switching means includes a P-channel MOS FET.

* * * * *